United States Patent
Su et al.

(10) Patent No.: US 9,227,840 B2
(45) Date of Patent: Jan. 5, 2016

(54) MICRO-ELECTRO MECHANICAL APPARATUS WITH PN-JUNCTION

(71) Applicant: Industrial Technology Research Institute, Hsinchu (TW)

(72) Inventors: Chung-Yuan Su, Taichung (TW); Chin-Fu Kuo, Tainan (TW); Chih-Yuan Chen, Taipei (TW); Chao-Ta Huang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/487,104

(22) Filed: Sep. 16, 2014

(65) Prior Publication Data
US 2015/0183632 A1 Jul. 2, 2015

(30) Foreign Application Priority Data
Dec. 31, 2013 (TW) .............. 102149148 A

(51) Int. Cl.
| | |
|---|---|
| H01L 43/06 | (2006.01) |
| B81B 7/00 | (2006.01) |
| G01P 15/00 | (2006.01) |
| G01R 33/00 | (2006.01) |
| G01R 33/028 | (2006.01) |

(52) U.S. Cl.
CPC ............. *B81B 7/008* (2013.01); *G01P 15/00* (2013.01); *G01R 33/00* (2013.01); *G01R 33/0286* (2013.01); *B81B 2201/025* (2013.01); *B81B 2201/0228* (2013.01); *B81B 2203/0109* (2013.01)

(58) Field of Classification Search
None
See application file for complete search history.

(56) References Cited

U.S. PATENT DOCUMENTS

| | | | |
|---|---|---|---|
| 5,576,250 A | * | 11/1996 | Diem .................... B81B 3/0051 257/254 |
| 5,731,703 A | | 3/1998 | Bernstein et al. |
| 5,739,431 A | | 4/1998 | Petri |

(Continued)

FOREIGN PATENT DOCUMENTS

| | | |
|---|---|---|
| CN | 2474994 | 1/2002 |
| CN | 102812375 | 12/2012 |

(Continued)

OTHER PUBLICATIONS

Dahai Ren, et al., "Design and Analyses of a MEMS Based Resonant Magnetometer," Sensors, vol. 9, Sep. 2, 2009, pp. 6951-pp. 6966.

(Continued)

*Primary Examiner* — Julio J Maldonado
*Assistant Examiner* — Cory Eskridge
(74) *Attorney, Agent, or Firm* — Jianq Chyun IP Office

(57) ABSTRACT

A micro-electro mechanical apparatus having a PN-junction is provided. The micro-electro mechanical apparatus includes a movable mass, a conductive layer, and an electrode. The movable mass includes a P-type semiconductor layer and an N-type semiconductor layer. The PN-junction is formed between the P-type semiconductor layer and the N-type semiconductor layer. The micro-electro mechanical apparatus is capable of eliminating abnormal voltage signal when an alternating current passes through the conductive layer. The micro-electro mechanical apparatus is adapted to measure acceleration and magnetic field. The micro-electro mechanical apparatus can be other types of micro-electro mechanical apparatus such as micro-electro mechanical scanning micromirror.

33 Claims, 11 Drawing Sheets

(56) References Cited

U.S. PATENT DOCUMENTS

| | | |
|---|---|---|
| 6,215,318 B1 | 4/2001 | Schoefthaler et al. |
| 6,275,034 B1 | 8/2001 | Tran et al. |
| 6,668,627 B2 | 12/2003 | Lange et al. |
| 6,820,469 B1 | 11/2004 | Adkins et al. |
| 7,253,615 B2 | 8/2007 | Berkcan et al. |
| 7,394,245 B2 | 7/2008 | Brunson et al. |
| 7,694,563 B2 | 4/2010 | Durante et al. |
| 7,696,749 B2 | 4/2010 | Sunier et al. |
| 7,784,344 B2 | 8/2010 | Pavelescu et al. |
| 8,134,375 B2 | 3/2012 | Boom |
| 8,220,330 B2 | 7/2012 | Miller et al. |
| 8,365,596 B2 | 2/2013 | Dwyer et al. |
| 8,471,557 B2 | 6/2013 | Baldo et al. |
| 2004/0036942 A1* | 2/2004 | Abu-Ageel ............ H02N 1/008 359/237 |
| 2004/0158439 A1 | 8/2004 | Kim et al. |
| 2009/0015250 A1 | 1/2009 | Sunier et al. |
| 2009/0150029 A1 | 6/2009 | Pavelescu et al. |
| 2011/0192229 A1 | 8/2011 | Chen et al. |
| 2012/0176128 A1 | 7/2012 | Seeger et al. |
| 2013/0002244 A1 | 1/2013 | Quevy |

FOREIGN PATENT DOCUMENTS

| | | |
|---|---|---|
| EP | 2236982 | 12/2011 |
| TW | 200537107 | 11/2005 |
| TW | 201217820 | 5/2012 |

OTHER PUBLICATIONS

Mo Li, et al., "Three-Axis Lorentz-Force Magnetic Sensor for Electronic Compass Applications," Journal of Microelectromechanical Systems, vol. 21, No. 4, Aug. 2012, pp. 1002-pp. 1010.

Ji-Man Cho, et al., "A Lorentz force based fusion magnetometer-accelerometer with dual functions for the electronic compass," Applied Physics Letters, vol. 91, Issue 20, Nov. 2007, pp. 203519-1-pp. 203519-3.

M. A. Farghaly, et al., "Novel Teeter-Totter 2-Axes MEMS Magnetometer with Equal Sensitivities," Thermal, Mechanical and Multi-Physics Simulation and Experiments in Microelectronics and Microsystems (EuroSimE), 2013 14th International Conference on, Apr. 2013, pp. 1-pp. 6.

Jukka Kyynarainen, et al., "A 3D micromechanical compass," Sensors and Actuators A: Physical, vol. 142, Issue 2, Sep. 10, 2007, pp. 561-pp. 568.

* cited by examiner

MICRO-ELECTRO MECHANICAL APPARATUS WITH PN-JUNCTION

CROSS-REFERENCE TO RELATED APPLICATION

This application claims the priority benefit of Taiwan application serial no. 102149148, filed on Dec. 31, 2013. The entirety of the above-mentioned patent application is hereby incorporated by reference herein and made a part of this specification.

BACKGROUND

1. Technical Field

The disclosure relates to a micro-electro mechanical apparatus with PN-junction.

2. Background

In recent years, due to the popularity of electronic devices such as smart phones, tablet PCs, game consoles, etc., the market of micro-electro mechanical sensors such as accelerometers and magnetometer has grown greatly. Thus, international companies have invested significant resources to develop high performance and low cost micro-electro mechanical sensors. For more and more applications of the electronic map with the function of auto orientation and the car navigation device equipped with the function of underground tunnel navigation, the new demand of the micro-electro mechanical sensors is to combine the global positioning system (GPS) with the micro-electro mechanical inertial sensors which are capable of providing direction information. Besides, to reduce the size of sensors and to keep up with the trend of being light and compact, researches of micro-electro mechanical inertial sensors tend to study how to integrate the accelerometer and the magnetometer into single sensor (i.e., multiple-axis sensing technique by using a same proof mass). In addition, it is an important issue to prevent the measured signals on different axis from interfering as new integrated micro-electro mechanical inertial sensors are developed.

FIG. 1 is the schematic diagram of a simplified X-axis micro-electro mechanical magnetometer. FIG. 2 is the schematic diagram of a simplified Z-axis micro-electro mechanical accelerometer. According to FIG. 1, the simplified X-axis micro-electro mechanical magnetometer 10 includes a movable mass 11, torsional beams 12, a coil 13, an electrode 14 and a substrate 15. The movable mass 11 is suspended above the substrate 15 and the electrode 14 by the torsional beams 12. The movable mass 11 is suitable for rotating about an axis along the torsional beam 12. In working status, an alternating current is inputted into the coil 13, wherein the current frequency is in consistent with the natural frequency of the movable mass 11. When there is a magnetic field B, Lorentz Force F is induced by the coil 13 and the magnetic field B, which drives the movable mass 11 to rotate. The magnitude of the Lorentz Force F can be calculated by the following equation:

$$F = I \cdot (\vec{L} \times \vec{B}),$$

where I is the magnitude of electrical current, B is the magnitude of magnetic field, and L is an effective length of the coil 13 which is perpendicular to the orientation of the magnetic field B. Then, the magnitude of the magnetic force can be obtained by detecting the capacitance variation between the movable mass 11 and the electrode 14. Since the coil 13 is electrically coupled to the alternating current (AC) power source, the direction of the electrical current and the value of the voltage are both changed periodically with the phase.

When the AC voltage is positive, the electrical current flows into the coil 13 from an end which is electrically coupled to the AC power source. The electrical current passes through the coil 13 on the movable mass 11, and flows into another end of the coil 13 which is electrically coupled to the ground GND. The potential difference between the coil 13 on the movable mass 11 and the substrate 15 causes accumulation of positive charges on the bottom surface of the movable mass 11, and causes accumulation of negative charges on the electrode 14 of the substrate 15. The amount of charges accumulated on the bottom surface of the movable mass 11 and the electrode 14 is accompanied with increase or decrease of the AC voltage. As the phase of the AC voltage changes (in a phase angle of 180°), and the AC voltage becomes a negative voltage, the electrical current flows from the end of the coil 13 which is electrically coupled to the ground to the end of the coil 13 which is electrically coupled to the AC power source. Owing to the change of the AC voltage, the electric potential on the bottom surface of the movable mass 11 is lower than that on the substrate 15, whereby the positive charges accumulate on the electrode 14 of the substrate 15, and the negative charges accumulate on the bottom surface of the movable mass 11. At the moment that the AC voltage alters, the electric charges on the bottom surface of the movable mass 11 and the electric charges on the electrode 14 of the substrate 15 decreases, and then an electrical current is induced on the electrode 14. The electrical current caused by changing of the amount of charges belongs to an induced current, which causes variation of voltage signal outputted from the readout circuit and makes the X-axis micro-electro mechanical magnetometer 10 to obtain an abnormal magnitude of the magnetic force.

Referring to FIG. 2, the simplified Z-axis micro-electro mechanical accelerometer 20 comprises a movable mass 21, torsional beams 22, 23, an anchor (not shown) and an electrode 24. The position of the torsional beam 22 deviates the central line of the movable mass 21, which is configured to rotate about an axis. When acceleration Az along Z axis is applied to the micro-electro mechanical accelerometer 20, the movable mass 21 rotates about the axis. Afterwards, the value of the acceleration Az along Z axis can be obtained by detecting the capacitance variation between the movable mass 21 and the electrode 24.

However, the sensing signals of magnetic force and acceleration are coupled when a common proof mass is used to sensing the magnetic force and accelerometer simultaneously. In other words, the sensing signals of magnetic force and the sensing signals of acceleration are coupled with each other. Therefore, the sensing signals needs to be decoupled to obtain the magnitude of magnetic force and the magnitude of acceleration respectively, which increases the complexity of signal processing.

Furthermore, FIG. 3A illustrates a sensor for measuring magnetic force and acceleration simultaneously of a US patent publication 2004/0158439. FIG. 3B is a cross-sectional view of the sensor along line A-A' of FIG. 3A. According to FIGS. 3A and 3B, the sensor of FIG. 3A comprises a first movable structure 31 and a second movable structure 32, which respectively comprises a spring 31a and a spring 32a for supporting the mass 31b and mass 32b. The first and the second movable structures 31, 32 are arranged in parallel on the X-Y plane. And, electrical currents in different directions are applied to the mass 31b and mass 32b respectively. In the same magnetic field (e.g., the magnetic field Bx on X direction), the mass 31b and mass 32b move oppositely with the displacements +b and −b respectively. When an acceleration Az is applied, the two mass move in the same direction with the displacements −a and −a respectively. Therefore, the total displacement of the mass 31b is −a+b, and the total displacement of the mass 32b is −a−b, in the circumstance where the magnetic field and the acceleration both exist. The displacement caused by the magnetic field and the displacement caused by the acceleration can be respectively obtained by displacement relations of the two mass, and then magnitude of the magnetic force and the magnitude of acceleration are obtained.

SUMMARY

The disclosure provides a micro-electro mechanical apparatus comprising a substrate, a movable mass, a first conductive layer and a first electrical insulation layer. The substrate comprises a top surface and an electrode disposed thereon. The movable mass is disposed above the electrode and comprises a first P-type semiconductor layer, a first N-type semiconductor layer and a first PN-junction. The first N-type semiconductor layer is connected to the first P-type semiconductor layer, and the PN-junction is formed between the first P-type semiconductor layer and the first N-type semiconductor layer. The first electrical insulation layer is disposed between the movable mass and the first conductive layer.

The disclosure further comprises another micro-electro mechanical apparatus suitable for detecting a magnetic force. The micro-electro mechanical apparatus comprises a substrate, a first electrical insulation layer, a first conductive layer and a first spring. The substrate comprises a top surface and an electrode disposed thereon. A movable mass is disposed above the electrode and configured to rotate about an axis. The movable mass comprises a first P-type semiconductor layer, a first N-type semiconductor layer and a first PN-junction. The first P-type semiconductor layer has a bottom surface facing the electrode. The first N-type semiconductor layer has a bottom surface connected to the top surface of the first P-type semiconductor layer, and the first PN-junction is formed between the first P-type semiconductor layer and the first N-type semiconductor layer. The first electrical insulation layer is disposed on a top surface of the first N-type semiconductor and the first conductive layer is disposed on the first electrical insulation layer. The first spring is connected to the movable mass along a direction parallel to the axis. The first spring comprises a second P-type semiconductor layer, a second N-type semiconductor layer and a second PN-junction, wherein the second P-type semiconductor layer is connected to the first P-type semiconductor layer, the second N-type semiconductor layer has a bottom surface connected to a top surface of the second P-type semiconductor layer, and the second PN-junction is formed between the second P-type semiconductor layer and the second N-type semiconductor layer.

The disclosure further provides a micro-electro mechanical apparatus comprising a substrate, a movable mass, a first electrical insulation layer, a first conductive layer, a first spring and a second spring. The substrate comprises a top surface and an electrode disposed thereon. The movable mass is a frame which is disposed above the electrode and configured to rotate about an axis. The frame comprises a first P-type semiconductor layer, a first N-type semiconductor layer and a first PN-junction. The first P-type semiconductor layer has a bottom surface facing the electrode. The first N-type semiconductor layer has a bottom surface connected to a top surface of the first P-type semiconductor layer, and the first PN-junction is formed between the first P-type semiconductor layer and the first N-type semiconductor layer. The first electrical insulation layer is disposed on a top surface of the first N-type semiconductor. The first conductive layer is disposed on the first electrical insulation layer. The first spring is connected to the frame. The second spring is disposed in the frame and connected to the frame, and the second spring and the first spring are arranged along a straight line which is parallel to the axis.

The disclosure provides another micro-electro mechanical apparatus suitable for detecting a magnetic force and an acceleration. The micro-electro mechanical apparatus comprises a substrate, a movable mass, a first electrical insulation layer, a first conductive layer and a controlling and switching unit. The substrate comprises a top surface and an electrode disposed thereon. The movable mass is disposed above the electrode and configured to rotate about an axis. The movable mass comprises a first P-type semiconductor layer, a first N-type semiconductor layer and a first PN-junction. The first P-type semiconductor layer has a bottom surface facing the electrode. The first N-type semiconductor layer has a bottom surface connected to a top surface of the first P-type semiconductor layer, and the first PN-junction is formed between the first P-type semiconductor layer and the first N-type semiconductor layer. The first electrical insulation layer is disposed on a top surface of the first N-type semiconductor. The first conductive layer is disposed on the first electrical insulation layer. The controlling and switching unit is configured to control the electric current supply for the first conductive layer.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

The disclosure provides a micro-electro mechanical apparatus with a PN-junction. The micro-electro mechanical apparatus comprises a movable mass, a conductive layer and an electrode. The movable mass comprises a P-type semiconductor layer and an N-type semiconductor layer. The PN-junction is formed between the P-type semiconductor layer and the N-type semiconductor layer. The micro-electro mechanical apparatus can prevent the output voltage of readout circuit from occurring abnormal variation when an alternating current flows into the conductive layer. The micro-electro mechanical apparatus provided in this disclosure can be adapted to detecting an acceleration and a magnetic force, or can be modified to be a micro-electro mechanical scanning micro-mirror.

The P-type semiconductor layer provided by the disclosure can be a silicon (Si) layer or a germanium (Ge) layer doped by some P-type impurities (e.g. boron, aluminum, gallium, indium, etc.).

The N-type semiconductor layer provided by the disclosure can be a silicon (Si) layer or a germanium (Ge) layer doped by some P-type impurities (e.g. nitrogen, phosphorus, arsenic, antimony, etc.).

Figure 1:
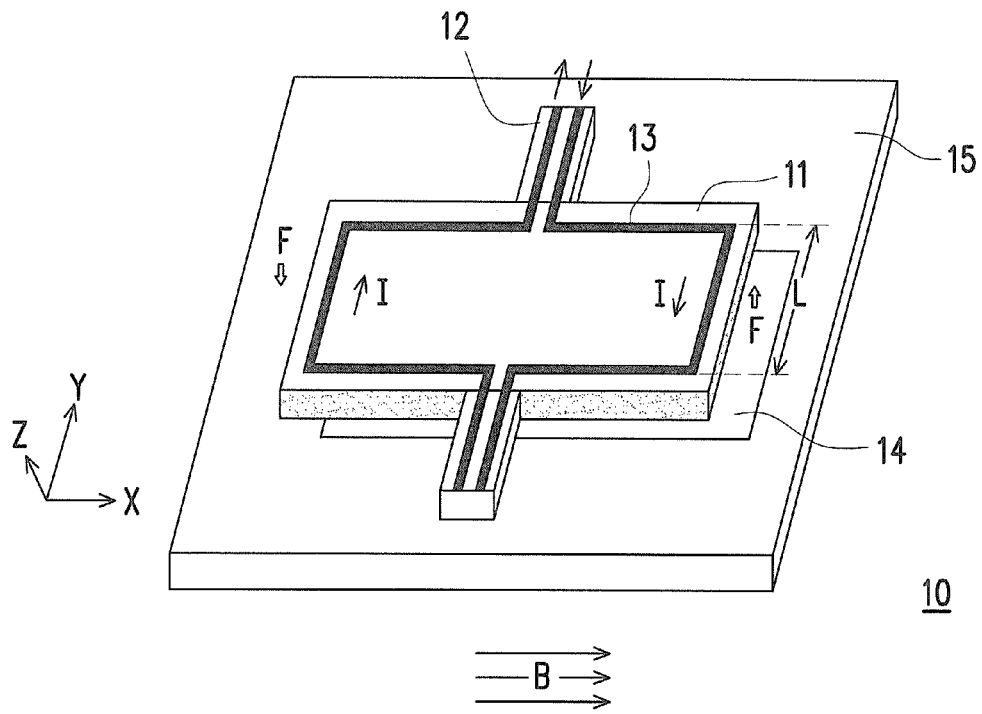
FIG. 1 is the schematic diagram of a simplified X-axis micro-electro mechanical magnetometer.
Figure 2:
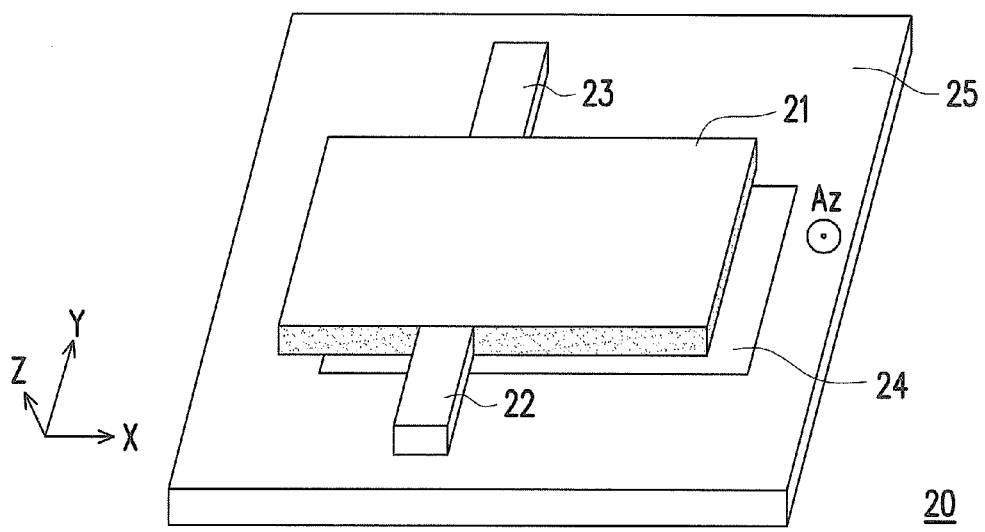
FIG. 2 is the schematic diagram of a simplified Z-axis micro-electro mechanical accelerometer.
Figure 3A:
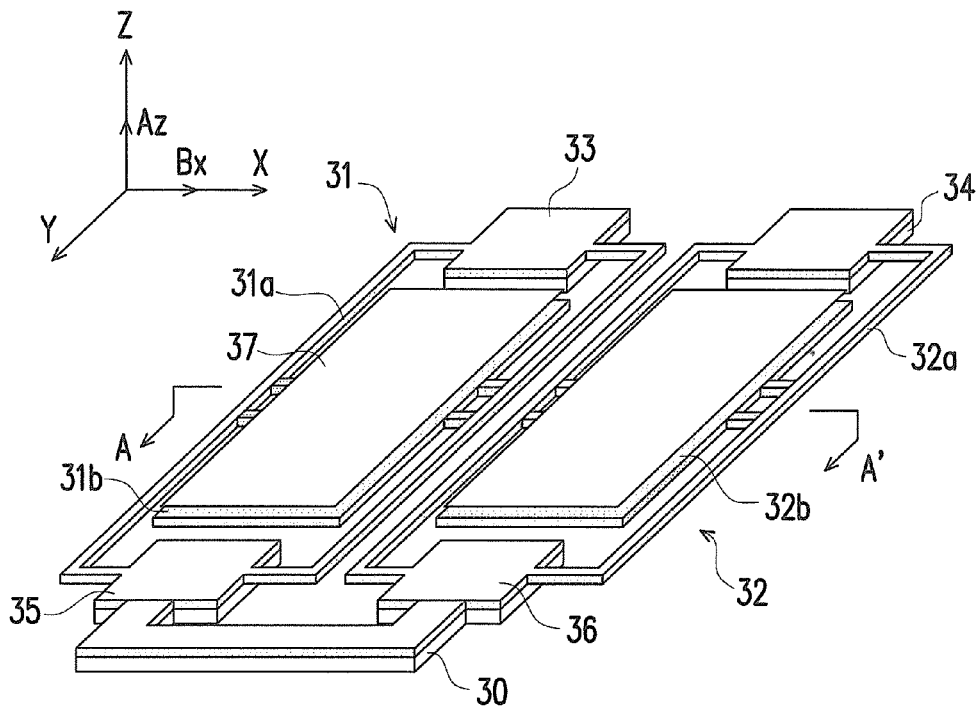
FIG. 3A illustrates a sensor for measuring magnetic field and acceleration simultaneously of a US patent publication 2004/0158439.
Figure 3B:
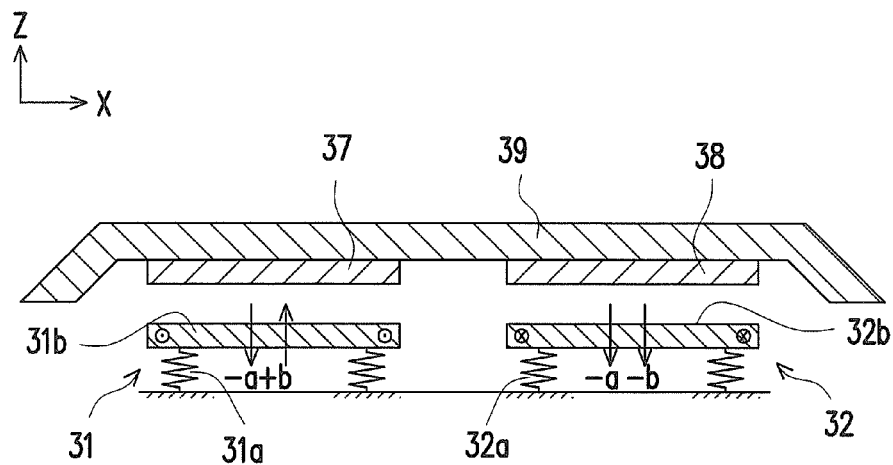
FIG. 3B is a cross-sectional view of the sensor along line A-A' of FIG. 3A.
Figure 4:
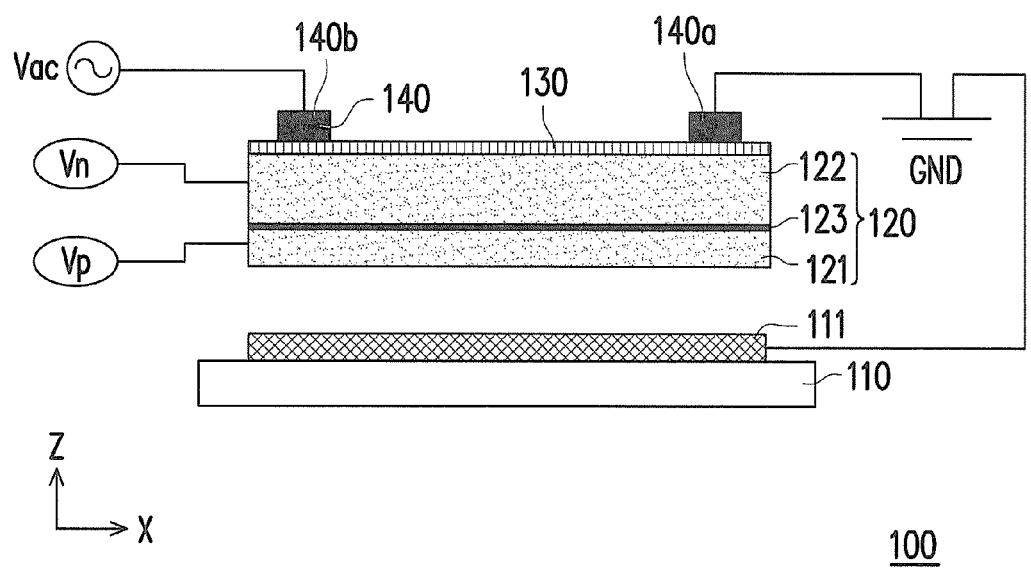
FIG. 4 is a schematic diagram of a micro-electro mechanical apparatus according to an embodiment of the disclosure.

FIG. 4 is a schematic diagram of a micro-electro mechanical apparatus 100 according to an embodiment of the disclosure. Referring to FIG. 4, the micro-electro mechanical apparatus 100 comprises a substrate 110, an electrode 111, a movable mass 120, a first conductive layer 140 and a first electrical insulation layer 130. The electrode 111 is disposed on a top surface of the substrate 110. The movable mass 120 is disposed above the electrode 111. The first electrical insulation layer 130 is disposed between the movable mass 120 and the first conductive layer 140 to electrically insulate the movable mass 120 and the first conductive layer 140 from each other.

The movable mass 120 comprises a first P-type semiconductor layer 121, a first type N-type semiconductor layer 122 and a first PN-junction 123. The first P-type semiconductor layer 121 is connected to the first N-type semiconductor layer 122 to form the first PN-junction 123 between the first P-type semiconductor layer 121 and the first N-type semiconductor layer 122.

The first conductive layer 140 comprises a first end 140a and a second end 140b. The first end 140a is electrically coupled to a ground GND and the second end 140b is electrically coupled to an AC power source Vac, by which an electrical current flows into the first conductive layer 140. Besides, the electrode 111 may also be electrically coupled to the ground GND. In one embodiment, the first end 140a is electrically coupled to the AC power source Vac, and the second end 140b is electrically coupled to the ground GND, by which an electrical current flows into the first conductive layer 140. In this case, the electrode 111 and second end 140b are electrically coupled to the ground GND. In addition, the first P-type semiconductor layer 121 is electrically coupled to a first polarization voltage Vp, the first N-type semiconductor layer 122 is electrically coupled to a second polarization voltage Vn. The second polarization voltage Vn is greater than or equal to the first polarization voltage Vp. The polarization voltage in the disclosure refers to a voltage that can induce charges to a conductor or a voltage that can induce charges to a semiconductor layer doped by some P-type impurities or N-type impurities. A Lorentz Force F is generated when a magnetic field in the circumstance is detected by the micro-electro mechanical apparatus 100. The Lorentz Force F is applied to the movable mass 120, and makes the movable mass 120 to translate or rotate. The translation or rotation of the movable mass 120 causes a capacitance variation between the first P-type semiconductor layer 121 and the electrode 111. Thus, by detecting the capacitance variation through the micro-electro mechanical apparatus 100, the magnitude of the magnetic force can be obtained through an application specific integrated circuit (ASIC). Moreover, since the second polarization voltage Vn is greater than or equal to the first polarization voltage Vp, a reverse bias is formed between the first P-type semiconductor layer 121 and the first N-type semiconductor layer 122. Therefore, the amount of electric charges on the first P-type semiconductor layer 121 and the electrode 111 of the substrate 110 are not increased or decreased, and causes no variation to the voltage signal outputted from readout circuit. As a result, abnormal sensing signal can be eliminated, and the accuracy of measuring the magnetic force can be improved.

According to the embodiment as shown in FIG. 4, structure of the micro-electro mechanical apparatus 100 can be modified to meet various functional requirements. For instance, the movable mass 120 may be a frame, wherein an anchor is disposed in the frame. Furthermore, a spring formed of cantilever beams can be connected to the movable mass 120 to allow a translation of the movable mass 120 along a vertical direction (Z axis). In an embodiment, the springs formed of two torsional beams can be connected to the movable mass 120 along an axis, to allow the movable mass 120 to rotate with respect to the central connection line of the two torsional beams.

According to an embodiment of FIG. 4, measuring sensitivity of the micro-electro mechanical apparatus 100 can be improved by providing different designs of structure. For instance, the first conductive layer 140 can be a conductive layer of a coil with single turn or a conductive layer of a coil with multiple turns. The Lorentz Force generated by the interaction of the electrical current and the magnetic field is increased when the first conductive layer 140 is the conductive layer coil with multiple turns, by which a larger translation and rotation of the movable mass 120 can be generated. Moreover, the movable mass 120 can be connected with two torsional beams along an axis which is the central connection line of the two torsional beams. The axis divides the movable mass into two parts. The movable mass 120 becomes an unbalanced mass when a distance from the axis to the gravity center of one part is different from that to the gravity center of another part. As a result, a larger rotation of the movable mass is generated when the Lorentz Force is applied on the movable mass, and the measuring sensitivity of the micro-electro mechanical apparatus is improved.

Figure 5A:
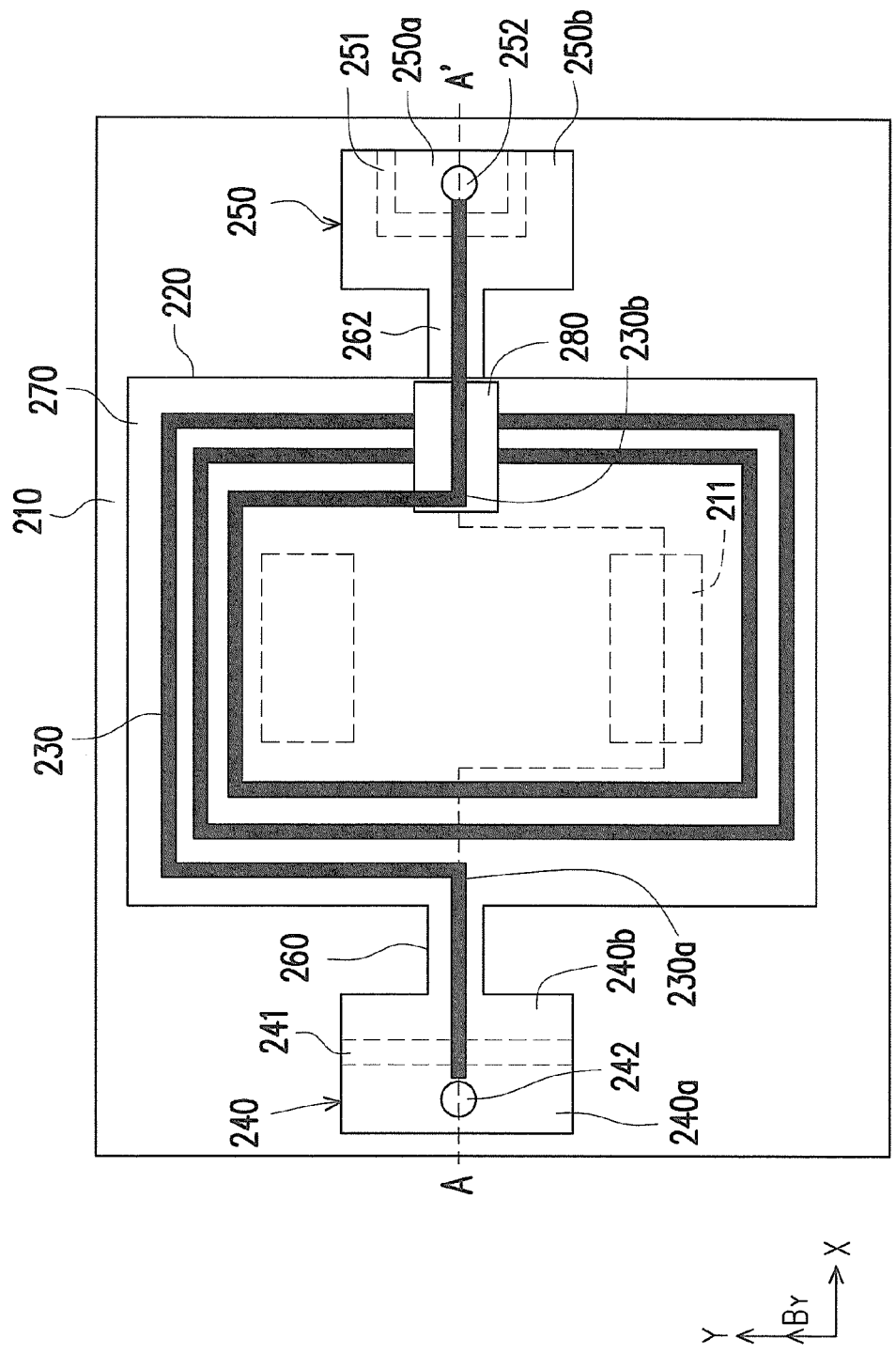
FIG. 5A is a top view of a micro-electro mechanical apparatus according to an embodiment of the disclosure.
Figure 5B:
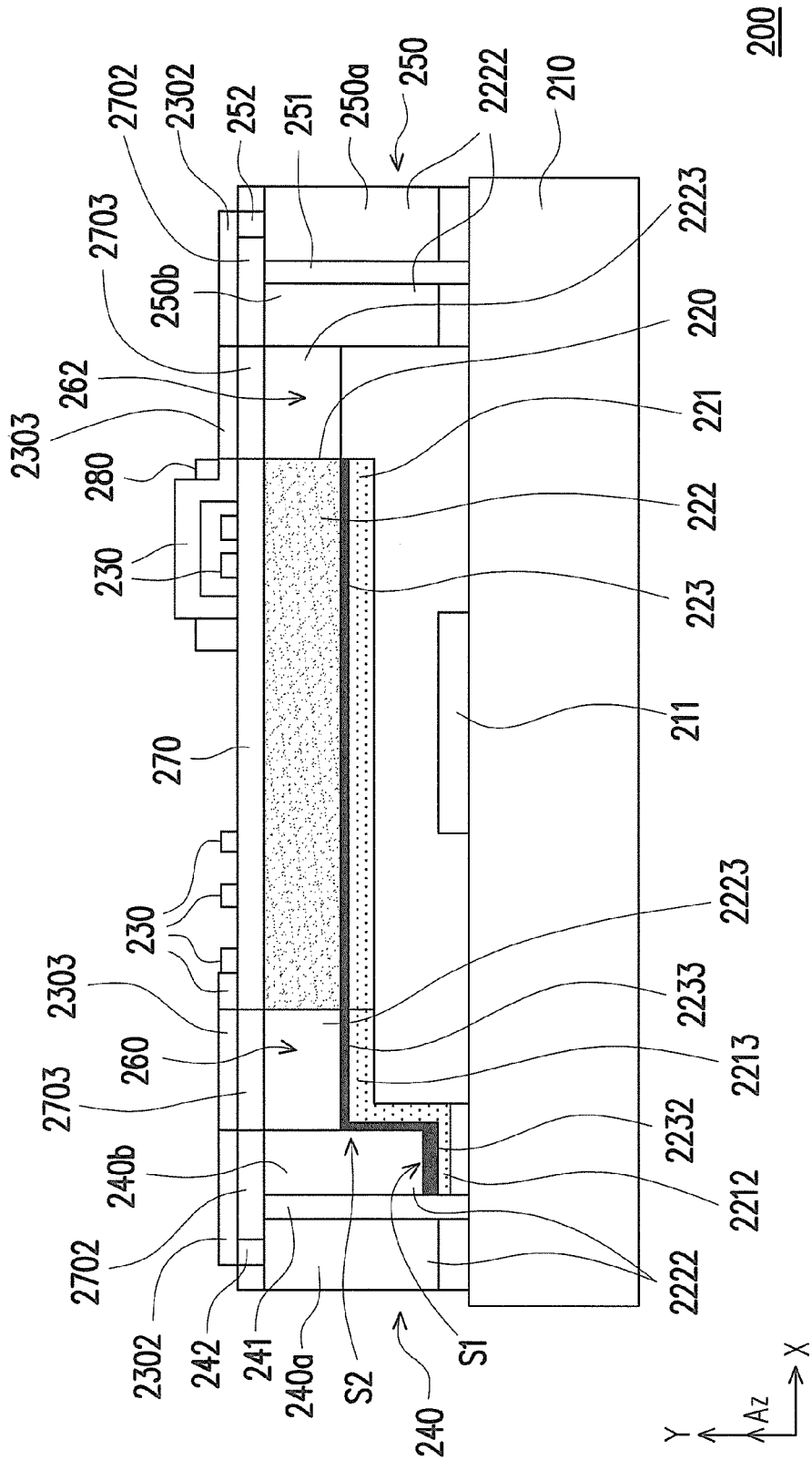
FIG. 5B is a cross-sectional view of the micro-electro mechanical apparatus along line A-A' of FIG. 5A.

FIG. 5A is a top view of a micro-electro mechanical apparatus according to an embodiment of the disclosure. FIG. 5B is a cross-sectional view of the micro-electro mechanical apparatus along line A-A' of FIG. 5A. Referring to FIG. 5A and FIG. 5B, the micro-electro mechanical apparatus 200 of the embodiment is adapted to detecting a magnetic force along Y axis. The micro-electro mechanical apparatus 200 comprises a substrate 210, an electrode 211, a movable mass 220, a first conductive layer 230, a first electrical insulation layer 270, first anchors 240, 250 and first springs 260, 262. The first anchors 240, 250 and the electrode 211 are disposed on a top surface of the substrate 210 respectively. The first electrical insulation layer 270 is disposed between a movable mass 220 and the first conductive layer 230. In an embodiment, the first electrical insulation layer 270 is disposed on the movable mass 220, and the first conductive layer 230 is disposed on the first electrical insulation layer 270 which is electrically insulate the movable mass 220 and the first conductive layer 230 from each other. The first spring 260, 262 suspend the movable mass 220 above the electrode 211 by respectively connecting the first anchor 240 and the movable mass 220 and connecting the first anchor 250 and the movable mass 220. Besides, the first conductive layer 230 can be conductive coil with a single turn, conductive coil with multiple turns or a conductive layer formed over the entire top surface of the movable mass 220.

The movable mass 220 of the micro-electro mechanical apparatus 200 comprises a first P-type semiconductor layer 221 and a first N-type semiconductor layer 222. A first PN-junction 223 is formed by connecting the first N-type semiconductor layer 222 and the first P-type semiconductor layer 221. In other words, the first PN-junction 223 is formed between the first P-type semiconductor layer 221 and the first N-type semiconductor layer 222. In one embodiment, the first P-type semiconductor layer 221 has a bottom surface facing the electrode 211, and the first N-type semiconductor layer 222 has a bottom surface connected to a top surface of the first P-type semiconductor layer 221. The first electrical insulation layer 270 is disposed on a top surface of the N-type semiconductor layer 222, and the first conductive layer 230 is disposed on the first electrical insulation layer 270.

The first anchor 240 of the micro-electro mechanical apparatus 200 comprises a second P-type semiconductor layer 2212 and a second N-type semiconductor layer 2222. A second PN-junction 2232 is formed by connecting the second N-type semiconductor layer 2222 and the second P-type semiconductor layer 2212. In other words, the second PN-junction 2232 is formed between the second P-type semiconductor layer 2212 and the second N-type semiconductor layer 2222. Besides, the second P-type semiconductor layer 2212 is disposed on a bottom surface S1 and a lateral surface S2 of the second N-type semiconductor layer 2222.

The first spring 260 of the micro-electro mechanical apparatus 200 comprises a third P-type semiconductor layer 2213 and a third N-type semiconductor layer 2223. A third PN-junction 2233 is formed by connecting the third N-type semiconductor layer 2223 and the third P-type semiconductor layer 2213. In other words, the third PN-junction 2233 is formed between the third P-type semiconductor layer 2213 and the third N-type semiconductor layer 2223. Besides, the first spring 260 further comprises a third electrical insulation layer 2703 and a third conductive layer 2303. The third electrical insulation layer 2703 is disposed on the third N-type semiconductor layer 2223, and the third conductive layer 2303 is disposed on the third electrical insulation layer 2703 which is configured to electrically insulate the first spring 260 and the third conductive layer 2303 from each other.

For increasing the number of electrical interconnections, the first anchor 240 can further comprise a first trench 241. The first trench 241 may divide the first anchor 240 into a first inner anchor 240b and a first outer anchor 240a which are electrically insulated from each other. The first inner anchor 240b comprises the second P-type semiconductor layer 2212 and the second N-type semiconductor layer 2222. The first outer anchor 240a comprises the second N-type semiconductor layer 2222. The second P-type semiconductor layer 2212 of the first inner anchor 240b is disposed on the bottom surface S1 and the lateral surface S2 of the second N-type semiconductor layer 2222 of the first inner anchor 240b.

The first anchor 240 further comprises a second electrical insulation layer 2702, a second conductive layer 2302 and a conductive post 242. The second electrical insulation layer 2702 is disposed on the first inner anchor 240b, the first outer anchor 240a and the first trench 241. The second conductive layer 2302 is disposed on the second electrical insulation layer 2702. The conductive post 242 penetrates the second electrical insulation layer 2702 of the first anchor 240 and connects the second conductive layer 2302 of the first anchor 240 and the first outer anchor 240a.

The third P-type semiconductor layer 2213 of the first spring 260 is connected to the first P-type semiconductor layer 221 and the second P-type semiconductor layer 2212 of the first inner anchor 240b to forming an electrical interconnection by which the first P-type semiconductor layer 221 can be electrically coupled to the first polarization voltage Vp.

Furthermore, in order to provide more electrical interconnections on the first anchor 250, the first anchor 250 further comprises a trench 251. The trench 251 can divide the first anchor 250 into an outer anchor 250a and an inner anchor 250b which are electrically insulated from each other. The inner anchor 250b comprises the second N-type semiconductor layer 2222. The outer anchor 250a also comprises the second N-type semiconductor layer 2222. The first anchor 250 further comprises the second conductive layer 2302, the second electrical insulation layer 2702 and a conductive post 252. The second electrical insulation layer 2702 is disposed on the inner anchor 250b, the outer anchor 250a and the trench 251. The second conductive layer 2302 is disposed on the second electrical insulation layer 2702. The conductive post 252 penetrates the second electrical insulation layer 2702 of the first anchor 250 and connects the second conductive layer 2302 of the first anchor 250 and the outer anchor 250a.

In addition, the first spring 262 of the micro-electro mechanical apparatus 200 comprises the third N-type semiconductor layer 2223, the third electrical insulation layer 2703 and the third conductive layer 2303. The third electrical insulation layer 2703 is disposed on the third N-type semiconductor layer 2223, and the third conductive layer 2303 is disposed on the third electrical insulation layer 2703 which is configured to electrically insulate the third N-type semiconductor layer 2223 and the third conductive layer 2303 from each other.

The third N-type semiconductor layer 2223 of the first spring 262 is connected to the first N-type semiconductor layer 222 of the movable mass 220 and the second N-type semiconductor layer 2222 of the inner anchor 250b to form an electrical interconnection by which the first N-type semiconductor layer 222 can be electrically coupled to the second polarization voltage Vn.

For the purpose of providing an electrical current to the first conductive layer 230 of the movable mass 220, the third conductive layer 2303 of the first spring 260 is connected to the first conductive layer 230 of the first anchor 240 and a first end 230a of the first conductive layer 230 to form an electrical interconnection by which the first end 230a can be electrically coupled to a ground GND. Besides, the third conductive layer 2303 of the first spring 262 is connected to the second conductive layer 2302 of the first anchor 250 and a second end 230b of the first conductive layer 230 to form an electrical interconnection by which the second end 230b can be electrically coupled to the AC power source.

In one embodiment, the first P-type semiconductor layer 221 can be electrically coupled to the first polarization voltage Vp, and the first N-type semiconductor layer 222 be electrically coupled to the second polarization voltage Vn. The second polarization voltage Vn is greater than or equal to the first polarization voltage Vp. Moreover, the first end 230a of the first conductive layer 230 is electrically coupled to the ground GND, and the second end 230*b* of the first conductive layer 230 is electrically coupled to the alternating current power source. A current is generated on the first conductive layer 230 due to a potential difference between the first end 230*a* and the second end 230*b*. In addition, the electrode 211 is electrically coupled to the ground GND together with the first end 230*a*.

The electrical current in first conductive layer 230 interacts with the magnetic field B, and then generates a Lorentz Force F when there is the magnetic field B or a component $B_Y$ thereof along Y axis in the circumstance of the micro-electro mechanical apparatus 200. The Lorentz Force F is applied to the movable mass 220, and make the movable mass 220 to rotate about the A-A' axis. The rotation of the movable mass 220 will cause a capacitance variation between the first P-type semiconductor layer 221 and the electrode 211. Thus, by detecting the capacitance variation through the micro-electro mechanical apparatus 200, the magnitude of the magnetic force can be obtained from the application specific integrated circuit (ASIC).

In addition, as to the above embodiment, since the second polarization voltage Vn is greater than or equal to the first polarization voltage Vp, a reverse bias is formed between the first P-type semiconductor layer 221 and the first N-type semiconductor layer 222. Therefore, when the AC voltage is conversed, the type of the electric charges on the bottom surface of the P-type semiconductor layer 221 maintains unchanged. In other words, as the AC voltage is conversed, no induced current is generated on the electrode 211, and causes no variation to the voltage signal outputted from readout circuit. As a result, abnormal sensing signal can be eliminated, and the accuracy of measuring the magnetic force by using the micro-electro mechanical apparatus 200 can be improved.

Figure 6A:
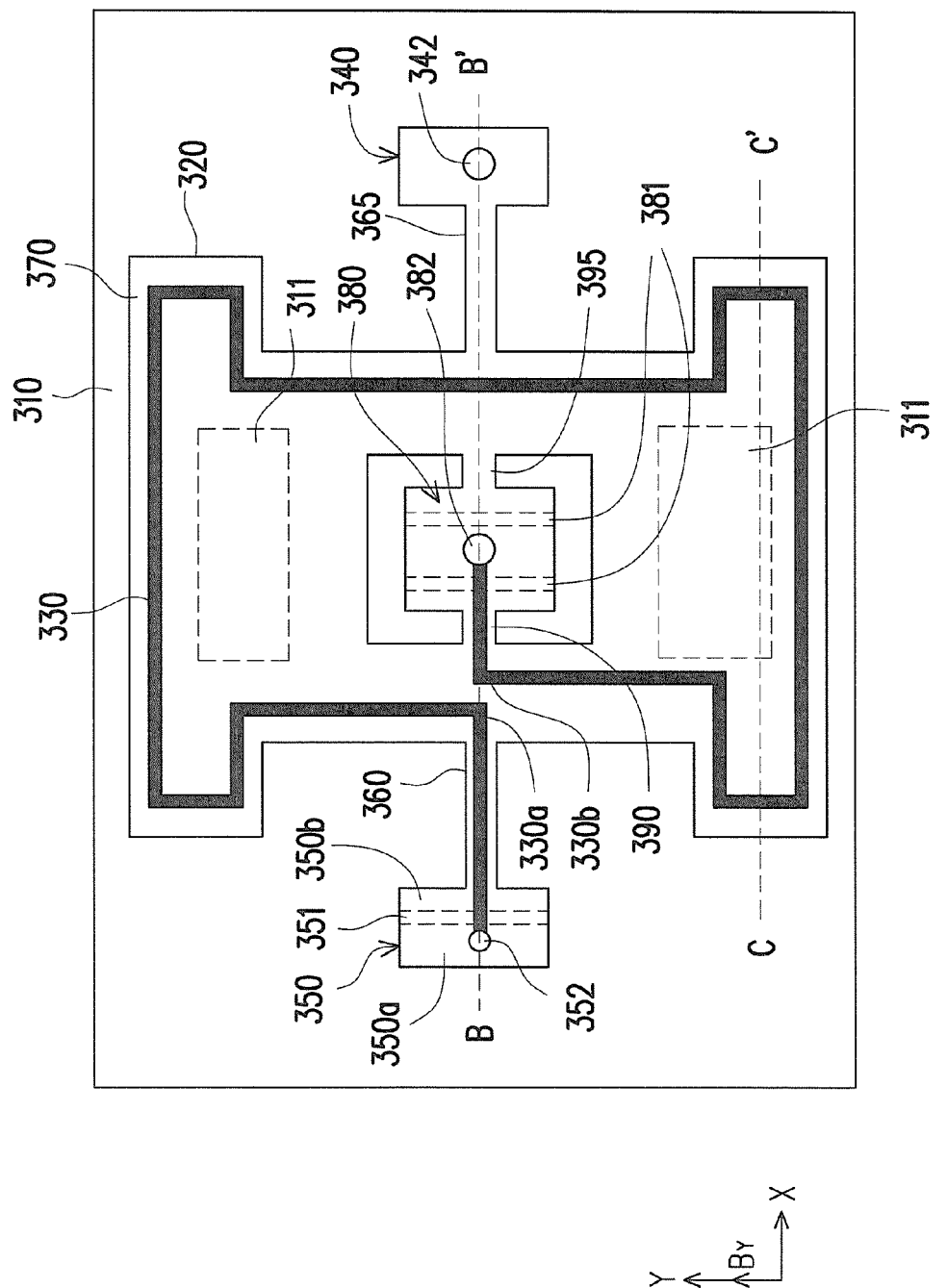
FIG. 6A is a top view of a micro-electro mechanical apparatus according to an embodiment of the disclosure.
Figure 6B:
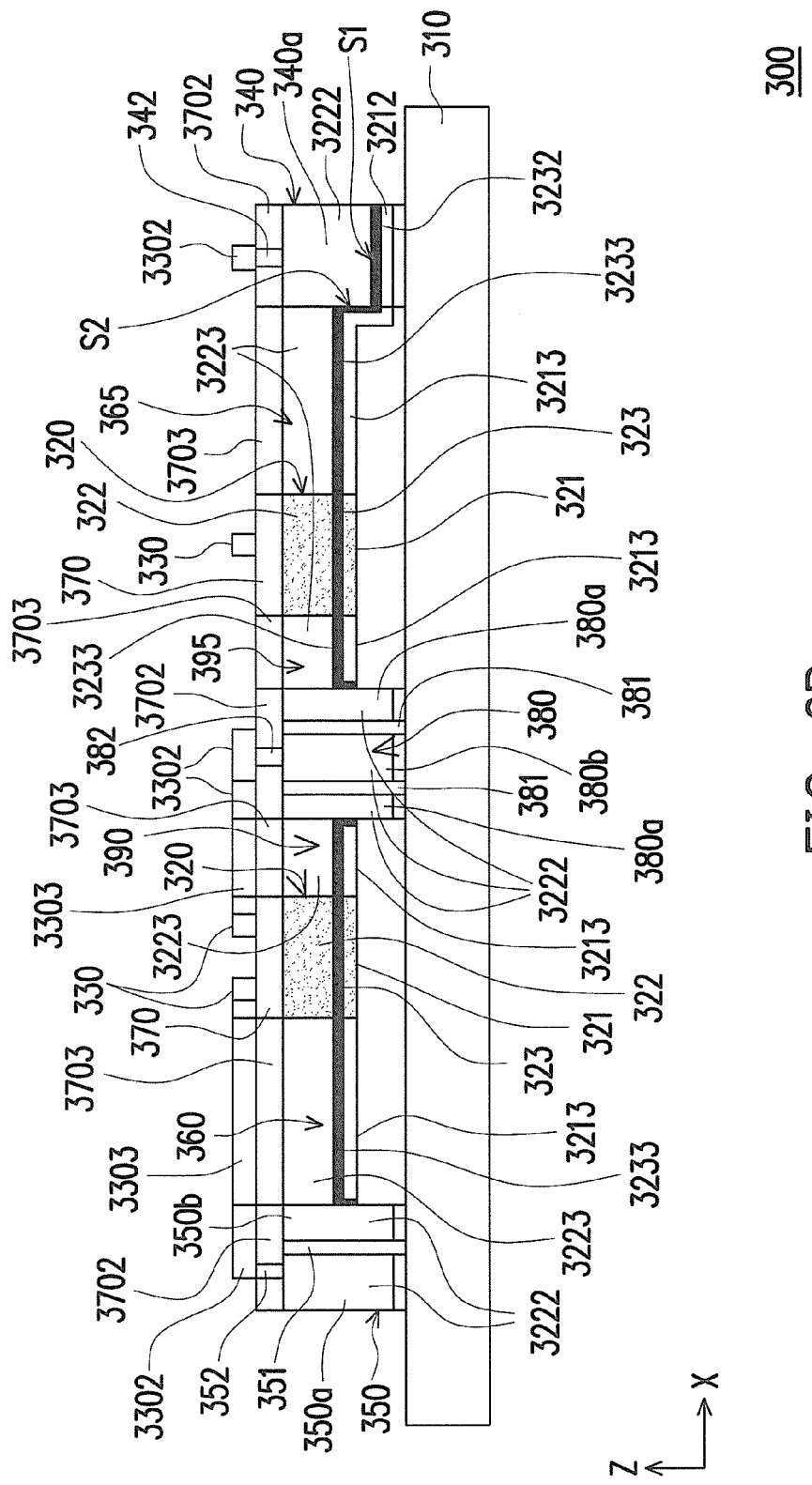
FIG. 6B is a cross-sectional view of the micro-electro mechanical apparatus along line B-B' of FIG. 6A.
Figure 6C:
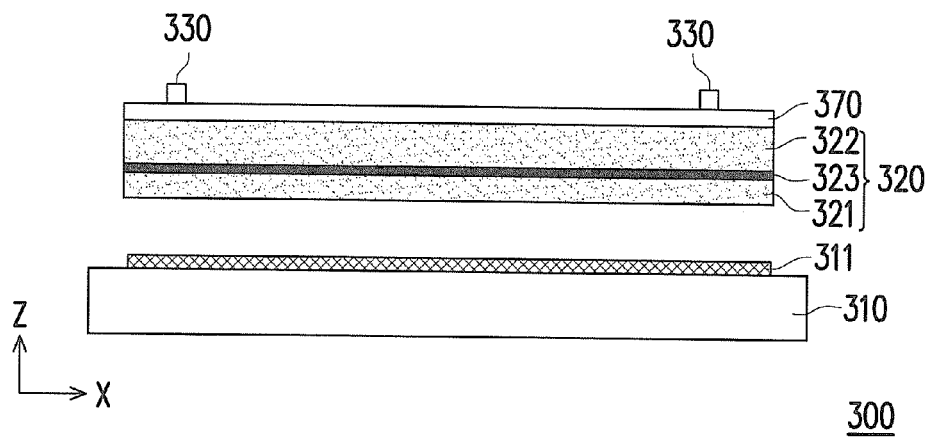
FIG. 6C is a cross-sectional view of the micro-electro mechanical apparatus along line C-C' of FIG. 6A.

FIG. 6A is a top view of a micro-electro mechanical apparatus according to an embodiment of the disclosure. FIG. 6B is a cross-sectional view of the micro-electro mechanical apparatus along line B-B' of FIG. 6A. FIG. 6C is a cross-sectional view of the micro-electro mechanical apparatus along line C-C' of FIG. 6A.

According to FIG. 6A, FIG. 6B and FIG. 6C, the micro-electro mechanical apparatus 300 comprises a substrate 310, an electrode 311, a movable mass 320, a first conductive layer 330, a first electrical insulation layer 370, first anchors 340, 350, a second anchor 380, first springs 360, 365, and second springs 390, 395.

The first anchors 340, 350, the second anchor 380 and the electrode 311 are disposed on a top surface of the substrate 310 respectively. The first electrical insulation layer 370 is disposed between the movable mass 320 and the first conductive layer 330. In more detail, the first electrical insulation layer 370 is disposed on the movable mass 320, and the first conductive layer 330 is disposed on the first electrical insulation layer 370 which is configured to electrically insulate the movable mass 320 and the first conductive layer 330 from each other. The first springs 360, 365 are connected to the first anchors 350, 340 and the movable mass 320 respectively. The second springs 390, 395 are connected to the second anchor 380 and the movable mass 320 respectively to suspend the movable mass 320 above the electrode 311. Besides, the first conductive layer 330 can be conductive coil with a single turn, conductive coil with multiple turns or a conductive layer formed over the entire top surface of the movable mass 320.

The movable mass 320 of the micro-electro mechanical apparatus 300 comprises a first P-type semiconductor layer 321 and a first N-type semiconductor layer 322. A first PN-junction 323 is formed by connecting the first N-type semiconductor layer 321 with the first P-type semiconductor layer 322. In other words, the first PN-junction 323 is formed between the first P-type semiconductor layer 321 and the first N-type semiconductor layer 322. The first P-type semiconductor layer 321 has a bottom surface facing the electrode 311, and a bottom surface of the first N-type semiconductor layer 322 is connected to a top surface of the first P-type semiconductor layer 321. The first electrical insulation layer 370 is disposed on a top surface of the N-type semiconductor layer 322, and the first conductive layer 330 is disposed on the first electrical insulation layer 370.

The first anchor 340 of the micro-electro mechanical apparatus 300 comprises a second P-type semiconductor layer 3212 and a second N-type semiconductor layer 3222. A second PN-junction 3232 is formed by connecting the second N-type semiconductor layer 3222 with the second P-type semiconductor layer 3212. In other words, the second PN-junction 3232 is formed between the second P-type semiconductor layer 3212 and the second N-type semiconductor layer 3222. Besides, the second P-type semiconductor layer 3212 is disposed on a bottom surface S1 and a lateral surface S2 of the second N-type semiconductor layer 3222.

The first spring 365 of the micro-electro mechanical apparatus 300 comprises a third P-type semiconductor layer 3213 and a third N-type semiconductor layer 3223. A third PN-junction 3233 is formed by connecting the third N-type semiconductor layer 3223 and the third P-type semiconductor layer 3213. In other words, the third PN-junction 3233 is formed between the third P-type semiconductor layer 3213 and the third N-type semiconductor layer 3223. Besides, the first spring 365 further comprises a third electrical insulation layer 3703 disposed on the third N-type semiconductor layer 3223.

The third P-type semiconductor layer 3213 of the first spring 365 is connected to the second P-type semiconductor layer 3212. The second P-type semiconductor layer 3212 of the first anchor 340 covers the entire bottom surface S1 of the second N-type semiconductor layer 3222 of the first anchor 340. The third P-type semiconductor layer 3213 of the first spring 365 is also connected to the first P-type semiconductor layer 321 of the movable mass 320 to form an electrical interconnection by which the first P-type semiconductor layer 321 can be coupled to the first polarization voltage Vp.

For increasing the numbers of electrical interconnection of the micro-electro mechanical apparatus 300, the first anchor 350 may further comprise a first trench 351. The first trench 351 can divide the first anchor 350 into a first inner anchor 350*b* and a first outer anchor 350*a* which are electrically insulated from each other. The first inner anchor 350*b* comprises the second N-type semiconductor layer 3222. The first outer anchor 350*a* also comprises the second N-type semiconductor layer 3222.

The first anchor 350 further comprises a second electrical insulation layer 3702, a second conductive layer 3302 and a conductive post 352. The second electrical insulation layer 3702 is disposed on the first inner anchor 350*b*, the first outer anchor 350*a* and the first trench 351. The second conductive layer 3302 is disposed on the second electrical insulation layer 3702. The conductive post 352 penetrates the second electrical insulation layer 3702 of the first anchor 350 and connects the second conductive layer 3302 of the first anchor 350 and the first outer anchor 350*a*.

The other first spring 360 of the micro-electro mechanical apparatus 300 comprises the third P-type semiconductor layer 3213 and the third N-type semiconductor layer 3223. The third PN-junction 3233 is formed by connecting the third N-type semiconductor layer 3223 with the third P-type semiconductor layer 3213. In other words, the third PN-junction 3233 is formed between the third P-type semiconductor layer 3213 and the third N-type semiconductor layer 3223. Besides, the first spring 360 further comprises the third electrical insulation layer 3703 and a third conductive layer 3303. The third electrical insulation layer 3703 is disposed on the third N-type semiconductor layer 3223. The third conductive layer 3303 is disposed on the third electrical insulation layer 3703 which is used to electrically insulate the third N-type semiconductor layer 3223 and the third conductive layer 3303 from each other.

The third N-type semiconductor layer 3223 of the first spring 360 is connected to the first N-type semiconductor layer 322 of the movable mass 320 and the second N-type semiconductor layer 3222 of the first inner anchor 350b to form an electrical interconnection by which the first N-type semiconductor layer 322 can be electrically coupled to the second polarization voltage Vn.

The movable mass 320 of the micro-electro mechanical apparatus 300 is a frame. The second anchor 380 comprises a second trench 381 which divides the second anchor 380 into a second inner anchor 380b and second outer anchors 380a which are electrically insulated from each other. The second electrical insulation layer 3702 is disposed on the second inner anchor 380b, the second outer anchor 380a and the second trench 381. The second conductive layer 3302 is disposed on the second electrical insulation layer 3702. A conductive post 382 penetrates the second electrical insulation layer 3702 of the second anchor 380. The conductive post 382 connects the second conductive layer 3302 of the second anchor 380 and the second inner anchor 380b. The second inner anchor 380b comprises the second N-type semiconductor layer 3222. The second outer anchor 380a also comprises the second N-type semiconductor layer 3222. In this embodiment, there provides no limitation to the shape of the second trench 381. For instance, the shape of the second trench 381 can be a circular ring or a square ring.

The second springs 390, 395 of the micro-electro mechanical apparatus 300 are disposed in the frame 320, and are connected to the movable mass 320. To make the frame to rotate about an axis, the second springs 390, 395 and the first springs 360, 365 are arranged along a straight line which is parallel to the B-B' axis. The second springs 390, 395 of the micro-electro mechanical apparatus 300 comprises the third N-type semiconductor layer 3223, the third electrical insulation layer 3703 and the third conductive layer 3303. The third electrical insulation layer 3703 is disposed on the third N-type semiconductor layer 3223, and the third conductive layer 3303 is disposed on the third electrical insulation layer 3703 which is used to electrically insulate the third N-type semiconductor layer 3223 and the third conductive layer 3303 from each other.

The third N-type semiconductor layer 3223 of the second springs 390, 395 is connected to the first N-type semiconductor layer 322 of the movable mass 320 and the second N-type semiconductor layer 3222 of the second outer anchor 380a, to form an electrical interconnection.

The third conductive layer 3303 of the first spring 360 can be connected to the second conductive layer 3302 of the first anchor 350 and a first end 330a of the first conductive layer 330 to form an electrical interconnection by which the first end 330a can be electrically coupled to the ground GND. The third conductive layer 3303 of the second spring 390 can be connected to the second conductive layer 3302 of the second anchor 380 and a second end 330b of the first conductive layer 330, to form an electrical interconnection by which the second end 330b can be electrically coupled to the AC power source Vac. Thus, the electrical current can flow into the first conductive layer 330 of the movable mass 320.

The micro-electro mechanical apparatus 300 is capable of sensing either magnetic field or acceleration by different electrically coupled configurations. The first P-type semiconductor layer 321 can be electrically coupled to the first polarization voltage Vp, and the first N-type semiconductor layer 322 can be electrically coupled to the second polarization voltage Vn when the micro-electro mechanical apparatus 300 is measuring the magnitude of magnetic field. The second polarization voltage Vn is greater than or equal to the first polarization voltage Vp. Moreover, the first end 330a of the first conductive layer 330 is electrically coupled to the ground GND and the second end 330b of the first conductive layer 330 is electrically coupled to the alternating current power source (not shown). The electrical current is generated on the first conductive layer 330 due to a potential difference between the first end 330a and the second end 330b. In addition, the electrode 311 is electrically coupled to the ground GND together with the first end 330a. An oppositely phased potential difference is generated when the first end 330a of the first conductive layer 330 is coupled to the alternating current power source and the second end 330b is electrically coupled to the ground, and an electrical current is generated and flows into the first conductive layer 330.

The electrical current in first conductive layer 330 interacts with the magnetic field B, and then generates a Lorentz Force F when there is the magnetic field B or the component thereof along the direction on Y axis in the circumstance of the micro-electro mechanical apparatus 300. The Lorentz Force F is applied to the movable mass (frame) 320, and makes the movable mass 320 to rotate about the B-B' axis. The rotation of the movable mass 320 causes a capacitance variation between the first P-type semiconductor layer 321 and the electrode 311. Thus, by detecting the capacitance variation through the micro-electro mechanical apparatus 300, the magnitude of the magnetic force can be obtained by the application specific integrated circuit (ASIC). Moreover, since the second polarization voltage Vn is greater than or equal to the first polarization voltage Vp, a reverse bias is formed between the first P-type semiconductor layer 321 and the first N-type semiconductor layer 322. As the AC voltage is conversed, the electric charges on a bottom surface of the P-type semiconductor layer 321 and the electrode 311 maintain unchanged. Therefore, the amount of the electric charges on the first P-type semiconductor layer 321 and the electrode 311 remains unchanged, to prevent the increase or decrease of the electric charges when the AC voltage is conversed. Because no induced current is generated on the electrode 311, variation to the voltage signal outputted from readout circuit can be eliminated to improve the accuracy of measuring the magnetic force.

In one embodiment, the first P-type semiconductor layer 321 is electrically coupled to the first polarization voltage Vp, and the electrode 311 is electrically coupled to the ground GND, to measure an acceleration in a vertical direction (Z axis) by the micro-electro mechanical apparatus 300. In other words, there is no need to input an electrical current into the first conductive layer 330 of the movable mass 320 when measuring the acceleration along Z axis by using the micro-electro mechanical apparatus 300. When there is an acceleration Az or a component thereof along the direction of Z axis in the circumstance of the micro-electro mechanical apparatus 300, the movable mass 320 rotates about the B-B' axis. The rotation of the movable mass 320 causes the capacitance variation between the first P-type semiconductor layer 321 and the electrode 311. Thus, by detecting the capacitance variation through the micro-electro mechanical apparatus 300, the magnitude of the acceleration can be obtained by the application specific integrated circuit (ASIC).

To enhance the effect of Lorentz Force F generated by the interaction between the electrical current and the magnetic field, the first conductive layer 330 of the micro-electro mechanical apparatus 300 can be the conductive layer coil with multiple turns. It can improve the sensitivity of measuring magnetic force by using the micro-electro mechanical apparatus 300. Moreover, a rotational axis B-B' is the line connecting the first spring 360, 365 and the second spring 390, 395 as shown in FIG. 6A The rotational axis B-B' divides the movable mass 320 into first part and second part. The movable mass 320 becomes an unbalanced mass when a distance from the rotational axis B-B' to a gravity center of the first part is different from that to a gravity center of the second part. As a result, the sensitivity of measuring the magnetic force and a sensitivity of measuring the acceleration are increased by using the micro-electro mechanical apparatus 300.

In one embodiment, measurement for the magnetic force along Y axis and the acceleration along Z axis is taken as an example; however, the disclosure is not restricted there to. Magnetic fields along other axis and accelerations along Z axis can also be detected by the micro-electro mechanical apparatus 300 when the orientation of the substrate 310 is modified. For instance, the micro-electro mechanical apparatus 300 in FIG. 6A, which takes the Z axis as the rotational axis, can be rotated in 90° to detect the magnitude of magnetic field along X axis and acceleration along Z axis.

Figure 6D:
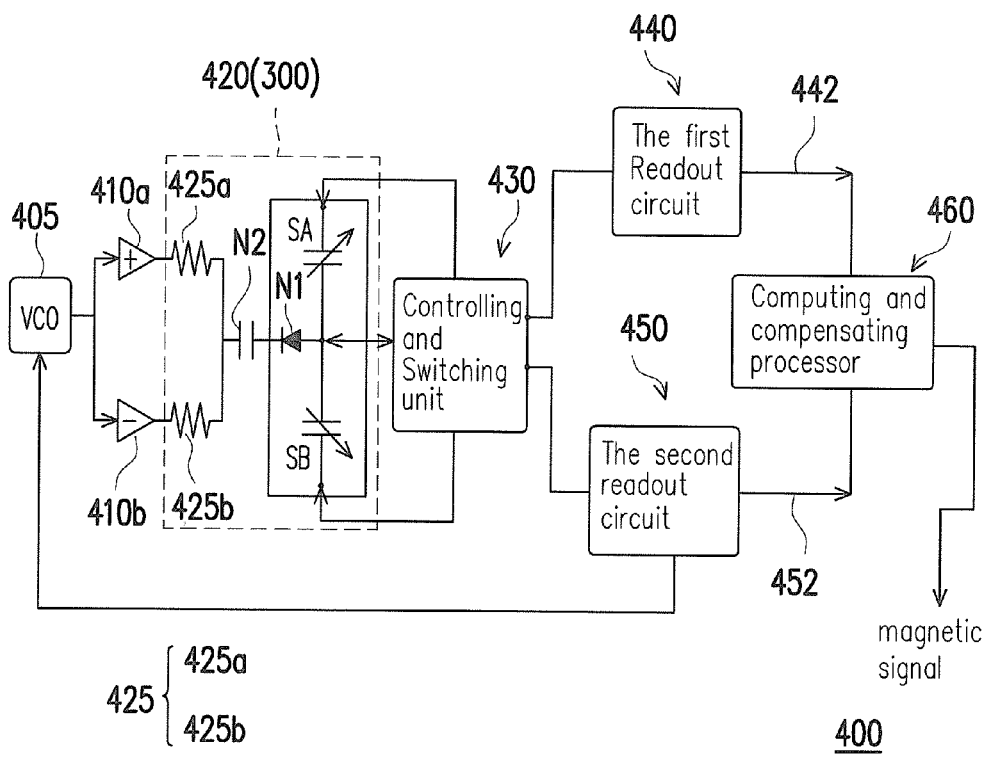
FIG. 6D is a diagram of a configuration of circuit system according to an embodiment of the disclosure.

To prevent a signal of acceleration and a signal of magnetic force from being coupled with each other when measuring the magnetic field and the acceleration simultaneously, a micro-electro mechanical apparatus 400 having a sensor 420 as shown in FIG. 6D is provided. The micro-electro mechanical apparatus 400 comprises the sensor 420 (referring to the dashed border in FIG. 6D) and an application specific integrated circuit chip (ASIC Chip) (not shown). The sensor 420 comprises a resistor set 425 having a first resistor 425a and a second resistor 425b coupled in parallel, a PN-junction N1, a capacitor N2, and variable capacitors SA, SB. The application specific integrated circuit chip (not shown) comprises a voltage-controlled oscillator (VCO) 405, operational amplifiers (OP) 410a, 410b, a controlling and switching unit 430, a first readout circuit 440, a second readout circuit 450 and a computing and compensating processor 460.

In the present embodiment, the sensor 420 can be one of the micro-electro mechanical apparatus having movable mass with PN-junction such as the micro-electro mechanical apparatus 300 as shown in FIG. 6A through FIG. 6C. To be simplified, the above description to the micro-electro mechanical apparatus 300 is incorporated into the present embodiment. Elements of the micro-electro mechanical apparatus 300 in FIG. 6C can be represented by symbols in FIG. 6D. For example, the first conductive layer 330 is represented by the resistor set 425. The first end 330a and second end 330b of the first conductive layer 330 is represented by the first resistor 425a and the second resistor 425b of the resistor set 425 respectively. The first PN-junction 323 in FIG. 6C is represented by the PN-junction N1 in FIG. 6D. Furthermore, the capacitor between first conductive layer 330 and first N-type semiconductor layer 322 is represented by capacitor N2 in FIG. 6D. Besides, the variable capacitors SA, SB in FIG. 6D represent the differential capacitors formed by movable electrodes (not shown) and stationary electrodes (not shown) of the micro-electro mechanical apparatus 300 in FIG. 6C.

In one embodiment, the voltage-controlled oscillator 405, the operational amplifiers 410a, 410b and a switch (not shown) provide an AC power source (not shown) to the resistor set 425. Therefore, an electrical current can flow into the first resistor 425a of the resistor set 425, and flow out from the second resistor 425b of the first resistor set 425. On the other hand, by using the switch (not shown), the electrical current can flow into the second resistor 425b of the resistor set 425, and flow out from the first resistor 425a of the resistor set 425. Besides, the controlling and switching unit can allow the electrical current being inputted into the resistor set 425 or can allow the electrical current being not inputted into the resistor set 425.

When the micro-electro mechanical apparatus 400 is detecting the magnetic force and the acceleration simultaneously, the controlling and switching unit allows the electrical current being inputted into the resistor set 425. The controlling and switching unit 430 receives the second input signal and outputs the second input signal to the second readout circuit 450. The second input signal comprises a signal of capacitance variation due to the magnetic force and the acceleration. The second readout circuit 450 reads the second input signal from the controlling and switching unit 430 and generates a second output signal 452. The second output signal 452 is a coupled signal which comprises the signal caused by the acceleration and the signal caused by the magnetic force.

Further more, when the micro-electro mechanical apparatus 400 is only detecting the acceleration, the controlling and switching unit allows the electrical current not being inputted into the resistor set 425. In other words, there is no electrical current generated on the resistor set 425. The controlling and switching unit 430 receives the first input signal and output the first input signal to the first readout circuit 440. The first input signal is the signal of capacitance variation caused only by the acceleration. The first readout circuit 440 reads the first input signal from the controlling and switching unit 430 and generates a first output signal 442 which comprises the signal caused only by the acceleration.

The computing and compensating processor 460 calculates a difference of the second output signal 452 and the first output signal 442. The magnitude of the magnetic force can be obtained by the calculated difference.

The micro-electro mechanical apparatus 400 switches the first readout circuit 440 and the second readout circuit 450 by the method of time-division multiplexing, and reads the first and the second input signal in turn. Therefore, the micro-electro mechanical apparatus 400 can eliminate the noise from coupled signals when detecting the acceleration and the magnetic force simultaneously. It thus improves the accuracy of measuring.

Figure 6E:
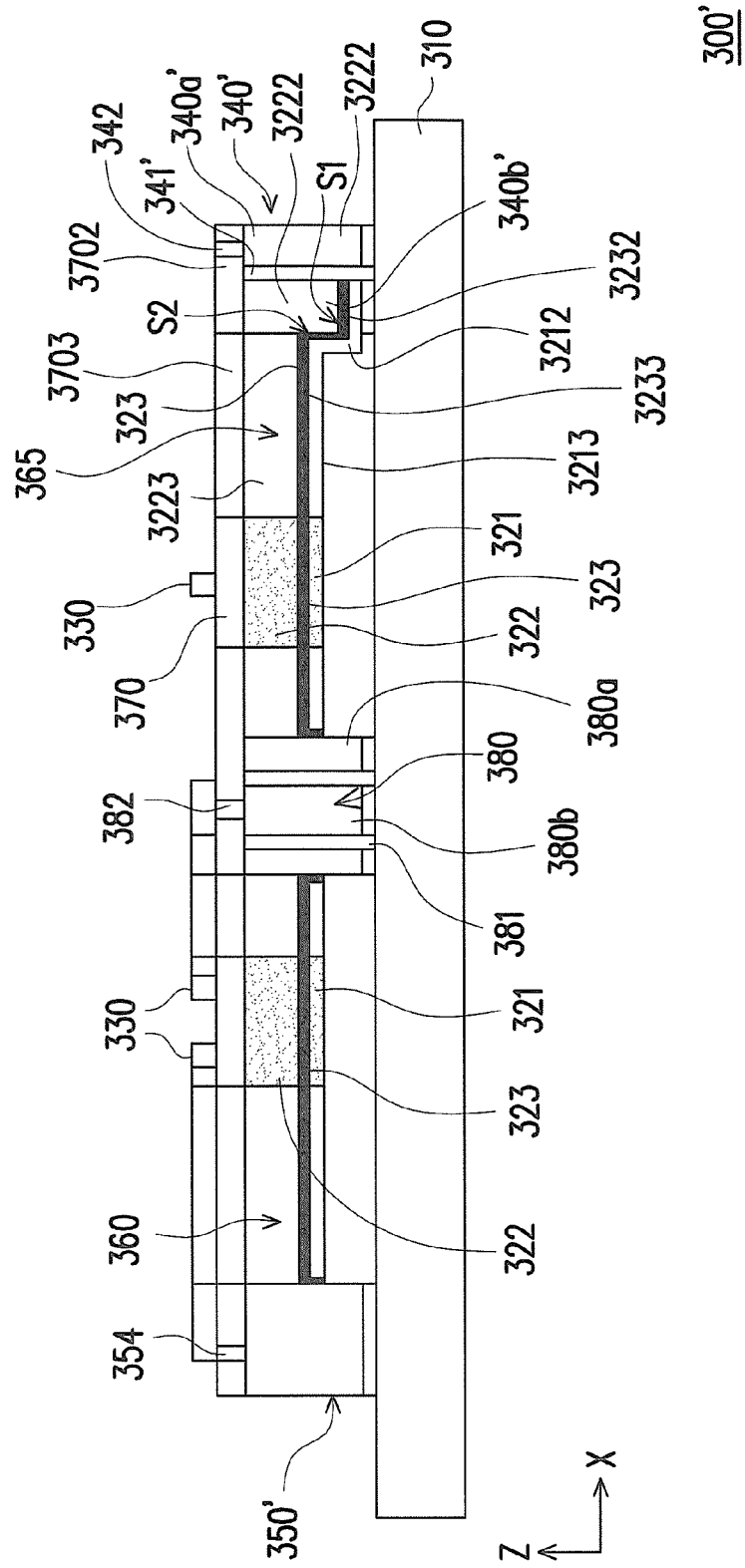
FIG. 6E is a cross-sectional view of a micro-electro mechanical apparatus according to another embodiment of the disclosure.

FIG. 6E is a cross-sectional view of a micro-electro mechanical apparatus according to another embodiment of the disclosure. The embodiment of FIG. 6E is similar to the embodiment of FIG. 6A, FIG. 6B and FIG. 6C. Thus, the same or similar elements are indicated by the same or similar reference numbers, and the relevant descriptions are not repeated herein. The difference between the present embodiment and the embodiments of FIG. 6A, FIG. 6B and FIG. 6C relies on the structures of first anchors 340', 350' of a micro-electro mechanical apparatus 300' in this embodiment and that of the first anchors 340, 350 of the micro-electro mechanical apparatus 300 in FIG. 6B.

As shown in FIG. 6E, the first anchor 340' comprises a first trench 341', which divides the first anchor 340' into a first inner anchor 340b' and a first outer anchor 340a' which are electrically insulated from each other. The first inner anchor 340b' comprises the second P-type semiconductor layer 3212 and the second N-type semiconductor layer 3222. The first outer anchor 340a' comprises the second N-type semiconductor layer 3222. The second P-type semiconductor layer 3212 of the first inner anchor 340b' is disposed on a bottom surface S1 and a lateral surface S2 of the second N-type semiconductor layer 3222 of the first inner anchor 340b'.

The first anchor 340' further comprises the second electrical insulation layer 3702 and the conductive post 342. The second electrical insulation layer 3702 is disposed on the first inner anchor 340b', the first outer anchor 340a' and the first trench 341'. The conductive post 342 penetrates the second electrical insulation layer 3702 of the first outer anchor 340a' and connects the first outer anchor 340a'.

The third P-type semiconductor layer 3213 of the first spring 365 is connected to the first P-type semiconductor layer 321 and the second P-type semiconductor layer 3212 of the first inner anchor 340b' to form an electrical interconnection by which the first P-type semiconductor layer 321 can be electrically coupled to the first polarization voltage Vp.

Besides, the second P-type semiconductor layer 3212 of the first inner anchor 340b' covers the bottom surface S1 and a partial lateral surface S2 of the second N-type semiconductor layer 3222. The first outer anchor 340a' comprises the second N-type semiconductor layer 3222. On the other hand, compared to the anchor 350 of the micro-electro mechanical apparatus 300, the anchor 350' of the micro-electro mechanical apparatus 300' has no trench. Therefore, in the condition without departing from the scope or spirit of the disclosure, the configuration of the trench of the micro-electro mechanical apparatus can be appropriately modified.

Figure 7A:
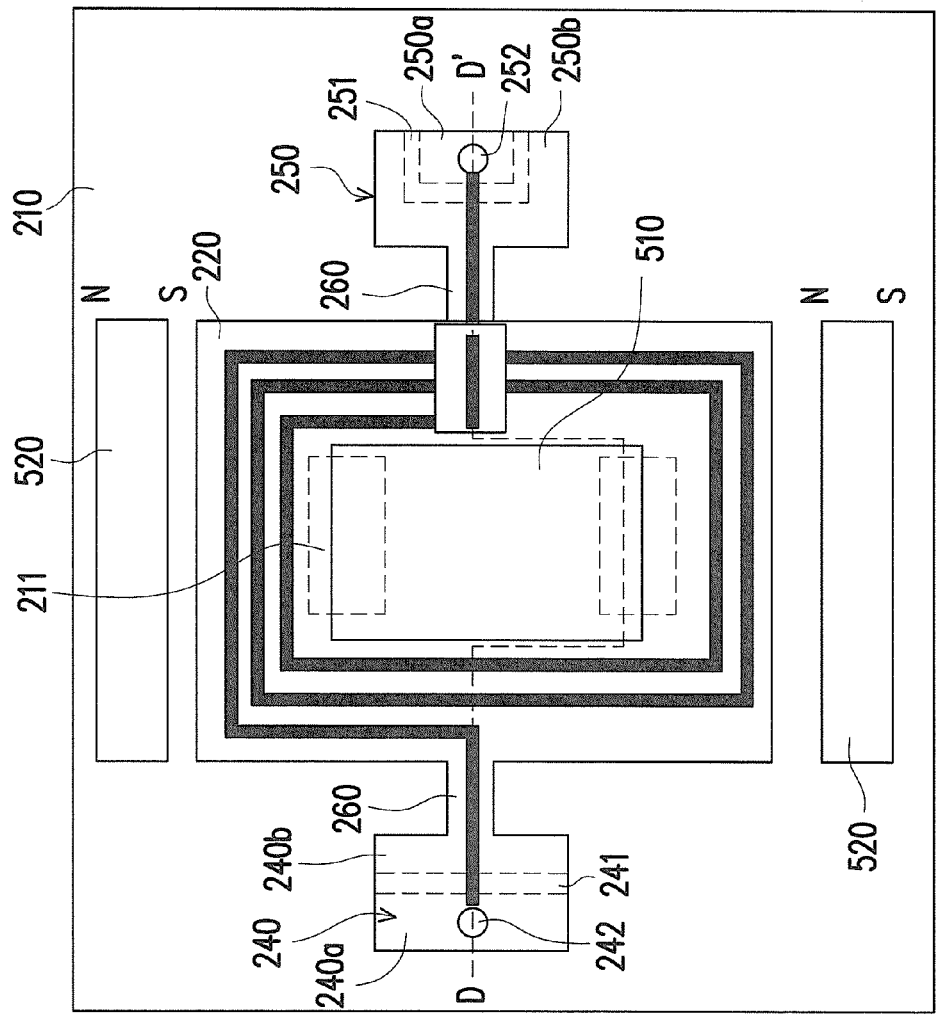
FIG. 7A is a top view of a micro-electro mechanical apparatus according to another embodiment of the disclosure.
Figure 7B:
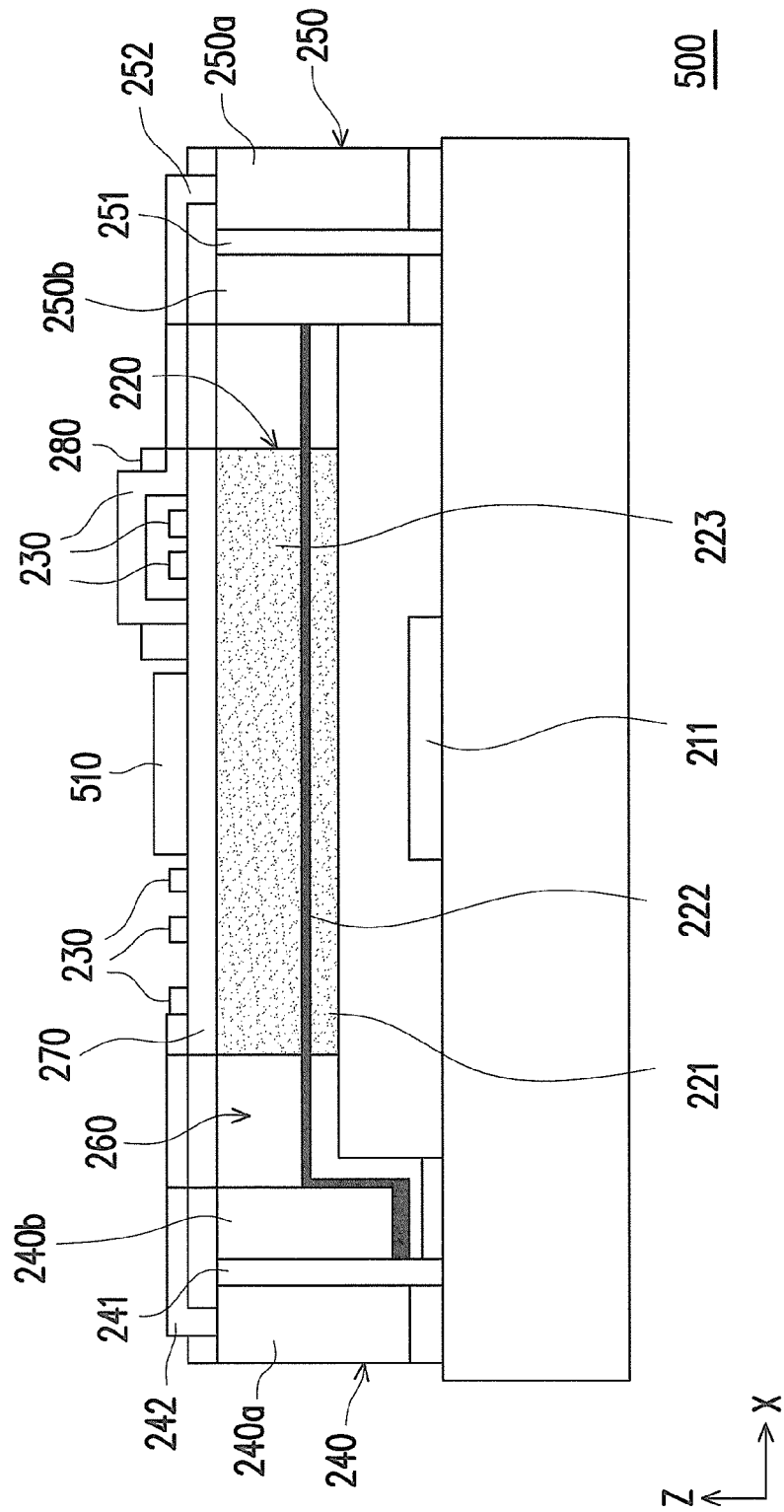
FIG. 7B is a cross-section diagram of the micro-electro mechanical apparatus along line D-D' of FIG. 7A.

The embodiment of FIG. 7A and FIG. 7B is similar to the embodiment of FIG. 5A and FIG. 5B. Therefore, the same or similar elements are indicated by the same or similar reference numbers, and the relevant descriptions are not repeated herein. Compared to the micro-electro mechanical apparatus 200, the micro-electro mechanical apparatus 500 further comprises a mirror layer 510 disposed on the movable mass 220. Permanent magnets 520 are disposed outside the two edges of the movable mass 220 as shown in FIG. 7A. In one embodiment, the micro-electro mechanical apparatus 500 can be a micro-electro mechanical scanning micro-mirror, which can be applied to video projection of a projector. The micro-electro mechanical apparatus 500 can produce images by reflecting lasers or lights to a screen by the mirror layer. More specifically, in the present embodiment, the electrical current flows into the first conductive layer 230 and interacts with the permanent magnet 520 on Y axis, and then generates a Lorentz Force, which makes the movable mass 220 to rotate about a D-D' axis. A rotating angle of the mirror layer 510 can be regulated by controlling the value of the inputted electrical current, and then the lasers or other lights can be precisely reflected to the screen through the mirror layer 510, and generate a projected image with good quality.

The capacitance variation between the first P-type semiconductor layer 221 of the movable mass 220 and the electrode 211 occurs when the micro-electro mechanical apparatus 500 rotates due to the Lorentz Force. The degree of rotation and vibrating frequency of the movable mass 220 can be calculated from the capacitance variation. The ASIC Chip (not shown) can adjust the amplitude and frequency of the input voltage to make the movable mass 220 achieving an optimized vibration state and improving the reflection quality of the mirror layer 510.

As shown in FIG. 7B, the first P-type semiconductor layer 221 of the movable mass 220 of the micro-electro mechanical apparatus 500 is electrically coupled to the first polarization voltage Vp, and the first N-type semiconductor layer 222 of the movable mass 220 electrically coupled to the second polarization Vn. The second polarization voltage Vn can be greater than or equal to the first polarization voltage Vp to produce a reverse bias on PN-junction 223 between the first P-type semiconductor layer 221 and the first N-type semiconductor layer 222, and the amount of the electric charges on a bottom surface of the first P-type semiconductor layer 221 maintains unchanged. As a result, increase or decrease of the electric charges on the first P-type semiconductor layer 221 and the electrode 211 can be eliminated. In other words, when the AC voltage is conversed, there is no induced current generated on the electrode, and the voltage signal outputted from the readout circuit is not abnormal. Therefore, the micro-electro mechanical apparatus provides a stable projecting quality due to the precise rotation of the movable mass 220.

In summary, the movable mass of the micro-electro mechanical apparatus provided by the disclosure comprises a conductive layer, an electrical insulation layer, a P-type semiconductor layer, a N-type semiconductor layer and a PN-junction formed between the P-type semiconductor layer and the N-type semiconductor layer. Therefore, compared to a conventional mass, a mass of the micro-electro mechanical apparatus of the disclosure can avoid the abnormal voltage signal outputted by a readout circuit as the alternating current being converted. The micro-electro mechanical apparatus provided by the disclosure can be adapted to detecting acceleration and magnetic force simultaneously. Besides, the micro-electro mechanical apparatus provided by the disclosure can be other capacitive micro-electro mechanical sensing device having the mass with a PN-junction, such as the micro-electro mechanical scanning micro-mirror.

It will be apparent to those skilled in the art that various modifications and variations can be made to the structure of the application without departing from the scope or spirit of the application. In view of the foregoing, it is intended that the application cover modifications and variations of this application provided they fall within the scope of the following claims and their equivalents.

What is claimed is:

1. A micro-electro mechanical apparatus, comprising:
   a substrate including an electrode disposed on a top surface of the substrate;
   a movable mass, being disposed above the electrode, including:
   a first P-type semiconductor layer;
   a first N-type semiconductor layer connected to the first P-type semiconductor layer;
   a first PN-junction formed between the first P-type semiconductor layer and the first N-type semiconductor layer;
   a first conductive layer; and
   a first electrical insulation layer disposed between the movable mass and the first conductive layer.

2. The micro-electro mechanical apparatus according to claim 1, further comprising a first anchor including:
   a second P-type semiconductor layer;
   a second N-type semiconductor layer connected to the second P-type semiconductor layer; and a second PN-junction formed between the second P-type semiconductor layer and the second N-type semiconductor layer.

3. The micro-electro mechanical apparatus according to claim 2, further comprising a first spring including:
a third P-type semiconductor layer;
a third N-type semiconductor layer connected to the third P-type semiconductor layer; and
a third PN-junction formed between the third P-type semiconductor layer and the third N-type semiconductor layer, wherein the first spring is connected to the movable mass, the third P-type semiconductor layer is connected to the first P-type semiconductor layer and to the second P-type semiconductor layer.

4. The micro-electro mechanical apparatus according to claim 3, further comprising a second spring, wherein the movable mass is a frame configured to rotate about an axis, the second spring is disposed in the frame and is connected to the movable mass, the second spring and the first spring are arranged along a straight line which is parallel to the axis.

5. The micro-electro mechanical apparatus according to claim 2, wherein the first anchor further comprises a first trench dividing the first anchor into a first inner anchor and a first outer anchor which are electrically insulated from each other, the first inner anchor comprises the second P-type semiconductor layer and the second N-type semiconductor layer, the first outer anchor comprises the second N-type semiconductor layer, the second P-type semiconductor layer of the first inner anchor is disposed on a bottom surface and a lateral surface of the second N-type semiconductor layer of the first inner anchor.

6. The micro-electro mechanical apparatus according to claim 5, wherein the first anchor further comprises:
a second electrical insulation layer disposed on the first inner anchor, the first outer anchor and the first trench;
a second conductive layer disposed on the second electrical insulation layer; and
a conductive post penetrating the second electrical insulation layer of the first anchor, wherein the conductive post connects the second conductive layer and the first outer anchor.

7. The micro-electro mechanical apparatus according to claim 5, further comprising a first spring including:
a third P-type semiconductor layer;
a third N-type semiconductor layer connecting the third P-type semiconductor layer; and
a third PN-junction formed between the third P-type semiconductor layer and the third N-type semiconductor layer, wherein the third P-type semiconductor layer is connected to the first P-type semiconductor layer and to the second P-type semiconductor layer of the first inner anchor.

8. The micro-electro mechanical apparatus according to claim 2, wherein the second P-type semiconductor layer is disposed on a bottom surface and a lateral surface of the second N-type semiconductor layer.

9. The micro-electro mechanical apparatus according to claim 3, wherein the second P-type semiconductor layer is disposed on a bottom surface and a lateral surface of the second N-type semiconductor layer, the second P-type semiconductor layer covers the entire bottom surface of the second N-type semiconductor layer, and the second P-type semiconductor layer is connected to the third P-type semiconductor layer.

10. The micro-electro mechanical apparatus according to claim 4, further comprising a second anchor disposed in the frame, wherein the second anchor comprises:
a second trench dividing the second anchor into a second inner anchor and a second outer anchor which are electrically insulated from each other;
a second electrical insulation layer disposed on the second inner anchor, the second outer anchor and the second trench;
a second conductive layer disposed on the second electrical insulation layer; and
a conductive post penetrating the second electrical insulation layer of the second anchor, wherein the conductive post connects the second conductive layer of the second anchor and the second inner anchor of the second anchor.

11. The micro-electro mechanical apparatus according to claim 1, wherein the first P-type semiconductor layer is electrically coupled to a first polarization voltage, the first N-type semiconductor layer is electrically coupled to a second polarization voltage, the second polarization voltage is greater than or equal to the first polarization voltage, the first conductive layer comprises a first end and a second end, the first end is electrically coupled to a ground, the second end is electrically coupled to the alternating current power source, and the electrode is electrically coupled to the ground together with the first end.

12. The micro-electro mechanical apparatus according to claim 1, wherein the movable mass is configured to rotate about an axis, a bottom surface of the first P-type semiconductor layer faces the electrode, a bottom surface of the first N-type semiconductor is connected to a top surface of the first P-type semiconductor, the first electrical insulation layer is disposed on a top surface of the first N-type semiconductor layer, and the first conductive layer is disposed on the first electrical insulation layer.

13. A micro-electro mechanical apparatus, being capable of detecting a magnetic force, comprising:
a substrate including an electrode disposed on a top surface of the substrate;
a movable mass, being disposed above the electrode and configured to rotate about an axis, including:
a first P-type semiconductor layer having a bottom surface facing the electrode;
a first N-type semiconductor layer having a bottom surface connected to a top surface of the first P-type semiconductor layer;
a first PN-junction formed between the first P-type semiconductor layer and the first N-type semiconductor layer;
a first electrical insulation layer disposed on a top surface of the first N-type semiconductor layer;
a first conductive layer disposed on the first electrical insulation layer; and
a first spring, being connected to the movable mass along a direction parallel to the axis, including:
a third P-type semiconductor layer connected to the first P-type semiconductor layer;
a third N-type semiconductor layer having a bottom surface connected to a top surface of the third P-type semiconductor layer; and
a third PN-junction formed between the third P-type semiconductor layer and the third N-type semiconductor layer.

14. The micro-electro mechanical apparatus according to claim 13, further comprising a second spring connected to the movable mass, wherein the movable mass is a frame, the second spring disposed in the frame, the second spring and the first spring are arranged along a straight line which is parallel to the axis.

15. The micro-electro mechanical apparatus according to claim 14, further comprising:
a second anchor, being disposed in the frame, including:
a second trench dividing the second anchor into a second inner anchor and a second outer anchor which are electrically insulated from each other;
a second electrical insulation layer disposed on the second inner anchor, the second outer anchor and the second trench;
a second conductive layer disposed on the second electrical insulation layer; and
a conductive post penetrating the second electrical insulation layer of the second anchor, wherein the conductive post connects the second conductive layer and the second inner anchor of the second anchor.

16. The micro-electro mechanical apparatus according to claim 13, wherein the first P-type semiconductor layer is electrically coupled to a first polarization voltage, the first N-type semiconductor layer is electrically coupled to a second polarization voltage, the second polarization voltage is greater than or equal to the first polarization voltage, the first conductive layer further comprises a first end and a second end, the first end is electrically coupled to a ground, the second end is electrically coupled to an alternating current power source, and the electrode is electrically coupled to the ground.

17. A micro-electro mechanical apparatus, comprising:
a substrate including an electrode disposed on a top surface of the substrate;
a movable mass, being disposed above the electrode and configured to rotate about an axis, including:
a first P-type semiconductor layer having a bottom surface facing the electrode;
a first N-type semiconductor layer having a bottom surface connected to a top surface of the first P-type semiconductor layer;
a first PN-junction formed between the first P-type semiconductor layer and the first N-type semiconductor layer;
a first electrical insulation layer disposed on a top surface of the first N-type semiconductor layer;
a first conductive layer disposed on the first electrical insulation layer;
a first spring connected to the frame; and
a second spring disposed in the frame and connected to the frame;
wherein the second spring and the first spring are arranged along a straight line which is parallel to the axis.

18. The micro-electro mechanical apparatus according to claim 17, further comprising a first anchor including:
a second P-type semiconductor layer having a bottom surface facing the substrate;
a second N-type semiconductor layer having a bottom surface connected to a top surface of the second P-type semiconductor layer; and
a second PN-junction formed between the second P-type semiconductor layer and the second N-type semiconductor layer.

19. The micro-electro mechanical apparatus according to claim 18, wherein the first anchor further comprises:
a first trench dividing the first anchor into a first inner anchor and a first outer anchor which are electrically insulated from each other, wherein the first inner anchor comprises the second P-type semiconductor layer and the second N-type semiconductor layer, the first outer anchor comprises the second N-type semiconductor layer, the second P-type semiconductor layer of the first inner anchor is disposed on the bottom surface and a lateral surface of the second N-type semiconductor layer of the first inner anchor.

20. The micro-electro mechanical apparatus according to claim 19, wherein the first anchor further comprises:
a second electrical insulation layer disposed on the first inner anchor, the first outer anchor and the first trench;
a second conductive layer disposed on the second electrical insulation layer; and
a conductive post penetrating the second electrical insulation layer of the first anchor, wherein the conductive post connects the second conductive layer and the first outer anchor of the first anchor.

21. The micro-electro mechanical apparatus according to claim 19, wherein the first spring comprises:
a third P-type semiconductor layer;
a third N-type semiconductor layer having a bottom surface connected to a top surface of the third P-type semiconductor; and
a third PN-junction formed between the third P-type semiconductor layer and the third N-type semiconductor layer, wherein the third P-type semiconductor layer is connected to the first P-type semiconductor layer and to the second P-type semiconductor layer of the first inner anchor.

22. The micro-electro mechanical apparatus according to claim 18, wherein the second P-type semiconductor layer is disposed on the bottom surface and a lateral surface of the second N-type semiconductor layer.

23. The micro-electro mechanical apparatus according to claim 17, further comprising:
a second anchor, being disposed in the frame, including:
a second trench dividing the second anchor into a second inner anchor and a second outer anchor which are electrically insulated from each other;
a second electrical insulation layer disposed on the second inner anchor, the second outer anchor and the second trench;
a second conductive layer disposed on the second electrical insulation layer; and
a conductive post penetrating the second electrical insulation layer of the second inner anchor, wherein the conductive post connects the second conductive layer of the second inner anchor and the second inner anchor.

24. A micro-electro mechanical apparatus, being adapted to detecting a magnetic force and an acceleration, comprising:
a substrate comprising an electrode disposed on a top surface of the substrate;
a movable mass, being disposed above the electrode and configured to rotate about an axis, including:
a first P-type semiconductor layer having a bottom surface facing the electrode;
a first N-type semiconductor layer having a bottom surface connected to a top surface of the first P-type semiconductor layer; and
a first PN-junction formed between the first P-type semiconductor layer and the first N-type semiconductor layer;
a first electrical insulation layer disposed on a top surface of the first N-type semiconductor layer;
a first conductive layer disposed on the first electrical insulation layer; and
a controlling and switching unit configured to control the electrical current supply for the first conductive layer.

25. The micro-electro mechanical apparatus according to claim 24, further comprising a first anchor including:
- a second P-type semiconductor layer having a bottom surface facing the electrode;
- a second N-type semiconductor layer having a bottom surface connected to a top surface of the second P-type semiconductor layer; and
- a second PN-junction formed between the second P-type semiconductor layer and the second N-type semiconductor layer.

26. The micro-electro mechanical apparatus according to claim 25, further comprising a first spring, being connected to the movable mass along a direction parallel to the axis, including:
- a third P-type semiconductor layer;
- a third N-type semiconductor layer having a bottom surface connected to a top surface of the third P-type semiconductor layer; and
- a third PN-junction formed between the third P-type semiconductor layer and the third N-type semiconductor layer, wherein the third P-type semiconductor layer is connected to the first P-type semiconductor layer and to the second P-type semiconductor layer.

27. The micro-electro mechanical apparatus according to claim 26, further comprising a second spring including third N-type semiconductor layer, wherein the movable mass is a frame configured to rotate about the axis, the second spring is disposed in the frame and connected to the movable mass, the second spring and the first spring are arranged along a straight line which is parallel to the axis.

28. The micro-electro mechanical apparatus according to claim 27, further comprising a second anchor, being disposed in the frame, including:
- a second N-type semiconductor layer;
- a second trench dividing the second anchor into a second inner anchor and a second outer anchor which are electrically insulated from each other, wherein the third N-type semiconductor layer of the second spring is connected to the second N-type semiconductor layer of the second outer anchor and the first N-type semiconductor layer of the movable mass;
- a second electrical insulation layer disposed on the second inner anchor, the second outer anchor and the second trench;
- a second conductive layer disposed on the second electrical insulation layer; and
- a conductive post penetrating the second electrical insulation layer of the second anchor, wherein the conductive post connects the second conductive layer of the second anchor and the second inner anchor.

29. The micro-electro mechanical apparatus according to claim 24, wherein the first P-type semiconductor layer is electrically coupled to a first polarization voltage, the first N-type semiconductor layer is electrically coupled to a second polarization voltage, the second polarization voltage is greater than or equal to the first polarization voltage, the first conductive layer further comprises a first end and a second end, the first end is electrically coupled to a ground, the second end is electrically coupled to the alternating current power source, and the electrode is electrically coupled to the ground.

30. The micro-electro mechanical apparatus according to claim 24, further comprising a first readout circuit electrically coupled to the electrode, wherein the first readout circuit receives a first input signal from the electrode and generates a first output signal when the controlling and switching unit allows an electrical current being not inputted into the first conductive layer.

31. The micro-electro mechanical apparatus according to claim 24, further comprising a second readout circuit electrically coupled to the electrode, wherein the second readout circuit receives a second input signal from the electrode and generates a second output signal when the controlling and switching unit allows an electrical current being inputted into the first conductive layer.

32. The micro-electro mechanical apparatus according to claim 24, further comprising a first readout circuit and a second readout circuit electrically which are coupled to the electrode respectively, wherein the first readout circuit receives a first input signal from the electrode and generates a first output signal when the controlling and switching unit allows an electrical current being not inputted into the first conductive layer, and the second readout circuit receives a second input signal from the electrode and generates a second output signal when the controlling and switching unit allows an electrical current being inputted into the first conductive layer.

33. The micro-electro mechanical apparatus according to claim 32, further comprising a computing and compensating processor electrically coupled to the first readout circuit and the second readout circuit, wherein the computing and compensating processor is used to calculate a difference between the second output signal and the first output signal.

* * * * *